United States Patent
Thalmayr et al.

(10) Patent No.: US 9,762,202 B2
(45) Date of Patent: Sep. 12, 2017

(54) METHOD OF MANUFACTURING A MECHANICAL RESONATING STRUCTURE

(71) Applicant: Analog Devices, Inc., Norwood, MA (US)

(72) Inventors: Florian Thalmayr, Unterhaching (DE); Jan H. Kuypers, Rehau (DE); Klaus Juergen Schoepf, Chandler, AZ (US)

(73) Assignee: Analog Devices, Inc., Norwood, MA (US)

( * ) Notice: Subject to any disclaimer, the term of this patent is extended or adjusted under 35 U.S.C. 154(b) by 501 days.

(21) Appl. No.: 14/177,571

(22) Filed: Feb. 11, 2014

(65) Prior Publication Data

US 2014/0306580 A1     Oct. 16, 2014

Related U.S. Application Data

(63) Continuation of application No. 13/186,428, filed on Jul. 19, 2011, now Pat. No. 8,689,426, which is a
(Continued)

(51) Int. Cl.
*H04R 31/00* (2006.01)
*H03H 9/02* (2006.01)
(Continued)

(52) U.S. Cl.
CPC ....... *H03H 9/02102* (2013.01); *H01L 41/253* (2013.01); *H01L 41/27* (2013.01);
(Continued)

(58) Field of Classification Search
CPC ........... H03H 9/02228; H03H 9/02574; H03H 9/02834
(Continued)

(56) References Cited

U.S. PATENT DOCUMENTS 3,916,348 A   10/1975   Toda et al.
4,278,492 A   7/1981    Cross
(Continued)

FOREIGN PATENT DOCUMENTS

EP    0375360    6/1990
EP    0706053    4/1996
(Continued)

OTHER PUBLICATIONS

Di Pietrantonio, "Guided Lamb Wave Electroacoustic Devices on Micromachined AlN/Al Plates", IEEE Transactions on Ultrasonics, Ferroelectrics, and Frequency Control. pp. 1175-1182. vol. 57, No. 5, May 2010.
(Continued)

*Primary Examiner* — Paul D Kim
(74) *Attorney, Agent, or Firm* — Wolf, Greenfield & Sacks, P.C.

(57) ABSTRACT

Methods are described for constructing a mechanical resonating structure by applying an active layer on a surface of a compensating structure. The compensating structure comprises one or more materials having an adaptive resistance to deform that reduces a variance in a resonating frequency of the mechanical resonating structure, wherein at least the active layer and the compensating structure form a mechanical resonating structure having a plurality of layers of materials A thickness of each of the plurality of layers of materials results in a plurality of thickness ratios therebetween.

13 Claims, 30 Drawing Sheets

Related U.S. Application Data continuation-in-part of application No. 12/639,161, filed on Dec. 16, 2009, now Pat. No. 8,058,769.

(60) Provisional application No. 61/138,171, filed on Dec. 17, 2008.

(51) Int. Cl.

| | | |
|---|---|---|
| *H03H 9/24* | (2006.01) | |
| *H01L 41/253* | (2013.01) | |
| *H01L 41/27* | (2013.01) | |
| *G01P 15/09* | (2006.01) | |
| *G01P 15/097* | (2006.01) | |
| *H01F 3/04* | (2006.01) | |
| *H01L 41/04* | (2006.01) | |

(52) U.S. Cl.
CPC .... *H03H 9/02228* (2013.01); *H03H 9/02275* (2013.01); *H03H 9/02574* (2013.01); *H03H 9/02834* (2013.01); *H03H 9/2405* (2013.01); *H04R 31/00* (2013.01); *G01P 15/097* (2013.01); *G01P 15/0922* (2013.01); *H01F 3/04* (2013.01); *H01L 41/04* (2013.01); *H03H 9/02244* (2013.01); *H03H 9/02535* (2013.01); *H03H 9/02984* (2013.01); *H03H 9/02992* (2013.01); *H03H 2009/241* (2013.01); *H04R 2201/003* (2013.01); *H04R 2217/00* (2013.01); *Y10T 29/42* (2015.01); *Y10T 29/49005* (2015.01); *Y10T 29/4908* (2015.01)

(58) Field of Classification Search
USPC ...... 29/25.35, 592.1, 594, 609.1; 310/313 A, 310/313 B, 313 C, 313 D, 340, 344, 345
See application file for complete search history.

(56) References Cited

U.S. PATENT DOCUMENTS

| | | | |
|---|---|---|---|
| 4,364,016 A | 12/1982 | Tanski | |
| 4,384,409 A | 5/1983 | Lao | |
| 4,395,849 A | 8/1983 | Kasai et al. | |
| 4,442,574 A | 4/1984 | Wanuga | |
| 4,449,107 A | 5/1984 | Asai et al. | |
| 4,454,440 A | 6/1984 | Cullen | |
| 4,454,639 A | 6/1984 | Dworsky | |
| 4,516,049 A | 5/1985 | Mikoshiba et al. | |
| 4,631,197 A | 12/1986 | Defreese | |
| 4,647,881 A | 3/1987 | Mitsutsuka | |
| 4,655,081 A | 4/1987 | Burdess | |
| 4,750,364 A | 6/1988 | Kawamura et al. | |
| 5,129,262 A | 7/1992 | White et al. | |
| 5,416,447 A | 5/1995 | Andres | |
| 5,501,103 A | 3/1996 | Woodruff et al. | |
| 5,677,485 A | 10/1997 | Nakamura | |
| 5,679,896 A | 10/1997 | Nakamura et al. | |
| 5,736,640 A | 4/1998 | Farine et al. | |
| 5,824,903 A | 10/1998 | Nakamura | |
| 5,889,208 A | 3/1999 | Nose | |
| 5,913,244 A | 6/1999 | Heinouchi | |
| 5,914,553 A | 6/1999 | Adams | |
| 5,939,956 A | 8/1999 | Arimura | |
| 5,969,249 A | 10/1999 | Roessig et al. | |
| 6,121,856 A | 9/2000 | Apostolos | |
| 6,124,765 A | 9/2000 | Chan | |
| 6,150,748 A | 11/2000 | Fukiharu | |
| 6,209,393 B1 | 4/2001 | Tomikawa et al. | |
| 6,307,447 B1 | 10/2001 | Barber et al. | |
| 6,420,816 B2 | 7/2002 | Getman et al. | |
| 6,420,820 B1 | 7/2002 | Larson | |
| 6,453,744 B2 | 9/2002 | Williams | |
| 6,516,665 B1 | 2/2003 | Varadan et al. | |
| 6,556,103 B2 * | 4/2003 | Shibata | H03H 9/0207 310/324 |
| 6,566,787 B2 | 5/2003 | Tsukahara et al. | |
| 6,577,040 B2 | 6/2003 | Nguyen | |
| 6,595,054 B2 | 7/2003 | Paros et al. | |
| 6,739,190 B2 | 5/2004 | Hsu | |
| 6,745,627 B1 | 6/2004 | Woodruff | |
| 6,828,713 B2 | 12/2004 | Bradley | |
| 6,831,531 B1 | 12/2004 | Giousouf | |
| 6,848,295 B2 | 2/2005 | Auner et al. | |
| 6,859,113 B2 | 2/2005 | Giousouf | |
| 6,909,221 B2 | 6/2005 | Ayazi | |
| 6,943,484 B2 | 9/2005 | Clark | |
| 6,954,020 B2 | 10/2005 | Ma | |
| 6,975,184 B2 | 12/2005 | Wang | |
| 6,987,432 B2 | 1/2006 | Lutz | |
| 6,995,622 B2 | 2/2006 | Partridge | |
| 7,005,946 B2 | 2/2006 | Duwel | |
| 7,024,934 B2 | 4/2006 | Yu | |
| 7,068,125 B2 | 6/2006 | Lutz | |
| 7,102,467 B2 | 9/2006 | Lutz | |
| 7,138,889 B2 * | 11/2006 | Lakin | H03H 9/586 310/328 |
| 7,170,369 B2 | 1/2007 | Huang | |
| 7,211,926 B2 | 5/2007 | Quevy | |
| 7,215,061 B2 | 5/2007 | Kihara | |
| 7,248,128 B2 | 7/2007 | Mattila | |
| 7,310,029 B2 | 12/2007 | Robert | |
| 7,327,070 B2 | 2/2008 | Tanaka | |
| 7,352,608 B2 | 4/2008 | Mohanty | |
| 7,471,028 B2 | 12/2008 | Onozawa | |
| 7,492,241 B2 | 2/2009 | Piazza | |
| 7,504,909 B2 | 3/2009 | Tada | |
| 7,528,685 B2 | 5/2009 | Tanaka | |
| 7,535,152 B2 | 5/2009 | Ogami | |
| 7,561,009 B2 | 7/2009 | Larson | |
| 7,602,099 B2 | 10/2009 | Fujimoto et al. | |
| 7,724,103 B2 | 5/2010 | Feng | |
| 7,728,483 B2 | 6/2010 | Tanaka | |
| 7,741,752 B2 * | 6/2010 | Shih | H03H 9/02574 310/313 B |
| 7,791,432 B2 | 9/2010 | Piazza | |
| 7,812,692 B2 * | 10/2010 | Ayazi | H03H 3/0076 310/321 |
| 7,868,517 B2 | 1/2011 | Belot | |
| 7,950,281 B2 | 5/2011 | Hammerschmidt | |
| 7,954,377 B2 | 6/2011 | Higuchi et al. | |
| 7,965,015 B2 | 6/2011 | Tai | |
| 8,035,277 B2 | 10/2011 | Barber et al. | |
| 8,058,769 B2 | 11/2011 | Chen et al. | |
| 8,362,675 B2 | 1/2013 | Chen et al. | |
| 8,395,456 B2 | 3/2013 | Badillo et al. | |
| 8,487,715 B2 | 7/2013 | Mohanty et al. | |
| 8,629,599 B2 | 1/2014 | Chen et al. | |
| 8,689,426 B2 | 4/2014 | Thalmayr et al. | |
| 8,937,425 B2 | 1/2015 | Chen et al. | |
| 2002/0075100 A1 | 6/2002 | Katohno | |
| 2002/0158700 A1 | 10/2002 | Nemoto | |
| 2003/0020565 A1 | 1/2003 | Cornett et al. | |
| 2003/0034852 A1 | 2/2003 | Kobayashi | |
| 2003/0146674 A1 | 8/2003 | Jacob | |
| 2004/0056728 A1 | 3/2004 | Dent | |
| 2004/0065940 A1 | 4/2004 | Ayazi et al. | |
| 2004/0239450 A1 | 12/2004 | Wang | |
| 2005/0073078 A1 | 4/2005 | Lutz | |
| 2005/0110598 A1 | 5/2005 | Larson | |
| 2005/0151600 A1 | 7/2005 | Takeuchi et al. | |
| 2005/0242904 A1 | 11/2005 | Lutz et al. | |
| 2006/0214747 A1 | 9/2006 | Lakin | |
| 2006/0279175 A1 | 12/2006 | Aigner | |
| 2007/0052324 A1 | 3/2007 | Chen et al. | |
| 2007/0188047 A1 | 8/2007 | Tanaka | |
| 2007/0222336 A1 | 9/2007 | Grannen | |
| 2007/0257750 A1 | 11/2007 | Tilmans et al. | |
| 2008/0028584 A1 | 2/2008 | Barber et al. | |
| 2008/0048804 A1 | 2/2008 | Volatier | |
| 2008/0087083 A1 | 4/2008 | Nishizawa et al. | |
| 2008/0143217 A1 | 6/2008 | Ho | |
| 2008/0186109 A1 | 8/2008 | Ho et al. | |
| 2008/0204153 A1 | 8/2008 | Yoshida | |
| 2008/0272852 A1 | 11/2008 | Six | |

(56) References Cited

U.S. PATENT DOCUMENTS

| | | |
|---|---|---|
| 2008/0284286 A1 | 11/2008 | Ogawa |
| 2008/0297281 A1 | 12/2008 | Ayazi |
| 2009/0026882 A1 | 1/2009 | Steeneken |
| 2009/0108381 A1 | 4/2009 | Buchwalter |
| 2009/0108959 A1 | 4/2009 | Piazza |
| 2009/0144963 A1 | 6/2009 | Piazza |
| 2009/0243747 A1 | 10/2009 | Gaidarzhy |
| 2009/0255338 A1 | 10/2009 | Watanabe |
| 2009/0294638 A1 | 12/2009 | Mohanty |
| 2010/0007443 A1 | 1/2010 | Mohanty |
| 2010/0026136 A1 | 2/2010 | Gaidarzhy |
| 2010/0038991 A1 | 2/2010 | Shih |
| 2010/0134207 A1 | 6/2010 | Mohanty |
| 2010/0155883 A1 | 6/2010 | Wenzler |
| 2010/0181868 A1 | 7/2010 | Gaidarzhy |
| 2010/0182102 A1 | 7/2010 | Kuypers |
| 2010/0237959 A1 | 9/2010 | Tanaka |
| 2010/0319185 A1 | 12/2010 | Ayazi et al. |
| 2010/0327701 A1 | 12/2010 | Grannen et al. |
| 2011/0133856 A1 | 6/2011 | Piazza et al. |
| 2012/0049965 A1 | 3/2012 | Chen et al. |
| 2012/0049980 A1 | 3/2012 | Chen et al. |
| 2012/0074810 A1 | 3/2012 | Chen et al. |
| 2015/0091412 A1 | 4/2015 | Chen et al. |

FOREIGN PATENT DOCUMENTS

| | | |
|---|---|---|
| EP | 0707212 | 4/1996 |
| EP | 0791832 | 8/1997 |
| EP | 1505722 | 2/2005 |
| JP | 59-064908 A | 4/1984 |
| JP | 02-007525 B2 | 2/1990 |
| JP | 10-209801 A | 8/1998 |
| JP | 2005-142902 A | 6/2005 |
| JP | 2006-042116 A | 2/2006 |
| JP | 2006-190797 A | 7/2006 |
| JP | 2006-286711 A | 10/2006 |
| JP | 2006-339941 A | 12/2006 |
| JP | 2008-098974 A | 4/2008 |
| JP | 2008-258884 A | 10/2008 |
| WO | WO98/01948 | 1/1998 |
| WO | WO98/37635 | 8/1998 |
| WO | WO02/17481 | 2/2002 |
| WO | WO 2004/095696 A2 | 11/2004 |
| WO | WO2006/000611 | 1/2006 |
| WO | WO2006/083482 | 8/2006 |
| WO | WO2006/130777 | 12/2006 |
| WO | WO2007/072408 | 6/2007 |
| WO | WO2007/072409 | 6/2007 |
| WO | WO2007/143520 | 12/2007 |
| WO | WO2010/011288 | 1/2010 |

OTHER PUBLICATIONS

Driscoll, M.M, "Voltage-Controlled Crystal Oscillators", IEEE Transactions on Electron Devices, Aug. 1971, vol. 18 (8), pp. 528-535.

Driscoll, M.M., "Linear Frequency Tuning of SAW Resonators", Trans. Ultrason. Ferroelectr. Freq. Control. IEEE 1991. Westinghouse Electr. Corp., Baltimore, MD, 38(4): 366-9.

Humad, "High Frequency Micromechanical Piezo-On Silicon Block Resonators", Int'l Electron Devices Meeting 2003 IEDM. Technical Digest, Washington, D.C. Dec. 8-10, 2003, New York, NY IEEE US Dec. 8, 2003, pp. 957-960.

Kadota, "High-Frequency Lamb Wave Device Composed of MEMS Structure Using LiNbO3 Thin Film and Air Gap", IEEE Transactions on Ultrasonics, Ferroelectrics, and Frequency Control. pp. 2564-2571. vol. 57, No. 11, Nov. 2010.

Onoe, "Several Extensions of Mindlin-Gazis'S Analysis of Rotated Y-Cut of Quartz (Invited)", 2008 IEEE. pp. 10-18.

Parker, "Precision Surface-Acoustic-Wave (SAW) Oscillators", IEEE Transactions on Ultrasonics, Ferroelectrics, and Frequency Control. pp. 342-364. vol. 35 No. 3, May 1988.

Patent Cooperation Treaty, "International Preliminary Report on Patentability and Written Opinion", for International Application No. PCT/US06/021298 mailed Nov. 6, 2006 and Dec. 6, 2007 respectively.

Patent Cooperation Treaty, "International Search Report and Written Opinion", for International Application No. PCT/US09/06587 mailed Feb. 26, 2010.

Patent Cooperation Treaty, "International Search Report and Written Opinion", for International Application No. PCT/US09/06590 mailed Mar. 1, 2010.

Patent Cooperation Treaty, "International Search Report and Written Opinion", for International Application No. PCT/US10/000301 mailed Sep. 3, 2010.

Piazza, "Low Motional Resistance Ring-Shaped Contour-Mode Aluminum Nitride Piezoelectric Micromechanical Resonators for UHF Applications", Micro Electro Mechanical Systems, 2005. MEMS 2005. 18th IEEE International Conference on Miami Beach, Florida, Jan. 30 -Feb. 3, 2005, Piscataway, NJ, US, IEEE 30 Jan. 2005, pp. 20-30.

Reinhardt, "Simulation FO BAW Resonators Frequency Adjustment", 2007 Ultrasonics Symposium. pp. 1444-1447.

Tirole, "Lamb Waves Pressure Sensor Using an A$\ell$ N/SI Structure", 1993 Ultrasonics Symposium. pp. 371-374.

Uno, "Frequency Trimming of Saw Devices", IEEE, Ultrasonics Symposium, 1994. pp. 181-187.

Wang, "In-Situ Frequency Trimming of SAW Resonator Using Conventional Crystal Resonator Fine Tuning Method With Gold Thin Film Addition", 2003 IEEE Ultrasonics Symposium. pp. 1730-1733.

Wang, "Method of Fabricating Multiple-Frequency Film Bulk Acoustic Resonators in a Single Chip", 2006 IEEE. pp. 793-796.

Wang, "The Analysis of the Third-Order Thickness-Shear Overtone Vibrations of Quartz Cristal Plates With Mindlin Plate Theory", 2008 IEEE International Ultrasonics Symposium Proceedings. pp. 2173-2176.

Wingqvist, "A Micromachined Thermally Compensated Thin Film Lamb Wave Resonator for Frequecy Control and Sensing Applications", IOP Publishing Ltd., Journal of Micromechanics and Microengineering 19 (2009) 035018. pp. 1-9.

Yatsuda, "Flip-Chip STW Filters and Frequency Trimming Method", 2002 IEEE International Frequency Control Symposium and PDA Exhibition. pp. 366-369.

European Search Report and Opinion mailed Jul. 20, 2012 for Application No. EP 09836502.6.

Notification of Reasons for Rejection mailed Jul. 30, 2013 for Application No. JP 2011-542128.

Notification of Reasons for Rejection mailed May 20, 2014 for Application No. JP 2011-542128.

Decision of Rejection mailed Feb. 24, 2015 for Application No. JP 2011-542128.

[No Author Listed], Technical Handbook of Elastic Wave Device. Japan Society for the Promotion of Science, Elastic Wave Device Technology 150th Committee. Nov. 30, 1991;15-6, 125-9, 319-21.

Kuypers et al., Intrinsic temperature compensation of aluminum nitride Lamb wave resonators for multiple-frequency references. Frequency Control Symposium. 2008 IEEE International. 2008;240-9.

Lakin et al., Temperature compensated bulk acoustic thin film resonators. Proceedings of IEEE Ultrasonics Symposium. 2000;1:855-8.

Spriggs et al., Mechanical Properties of Pure, Dense Aluminum Oxide as a Function of Temperature and Grain Size. J Amer Ceramic Soc. Jul. 1964; 47(7):323-7.

Yu et al., Ultra Temperature-Stable Bulk-Acoustic-Wave Resonators with SiO 2 Compensation Layer. IEEE Trans Ultrason Ferroelectr Freq Contr. 2007; 54(10):2102-9.

\* cited by examiner

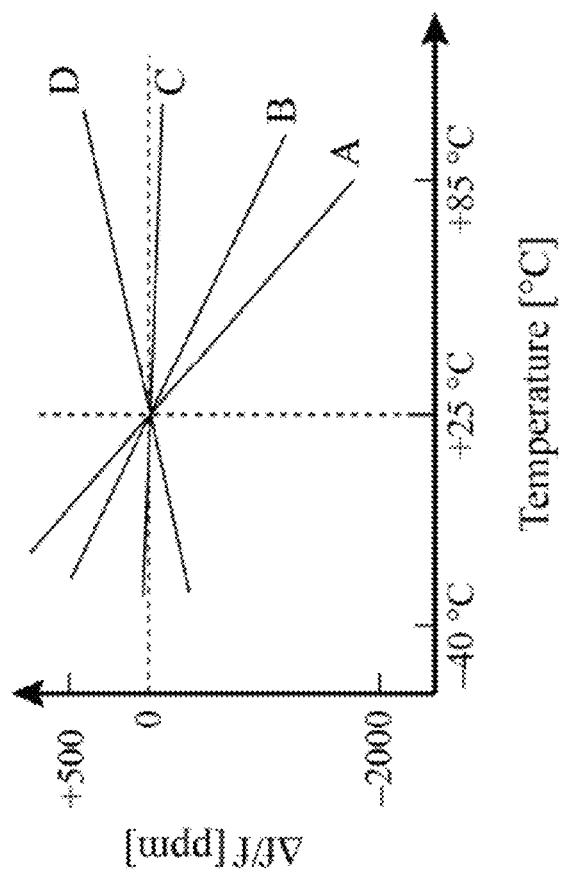
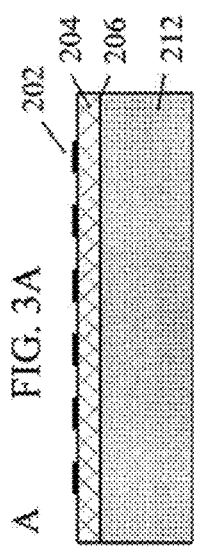
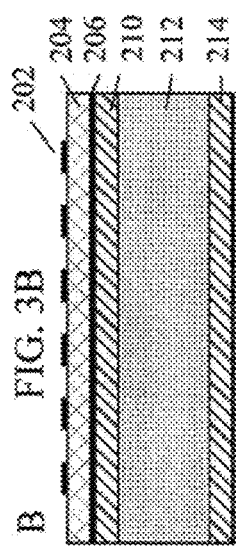
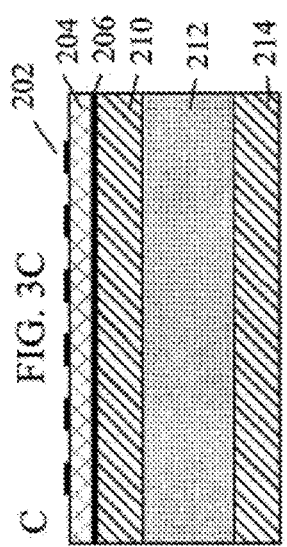
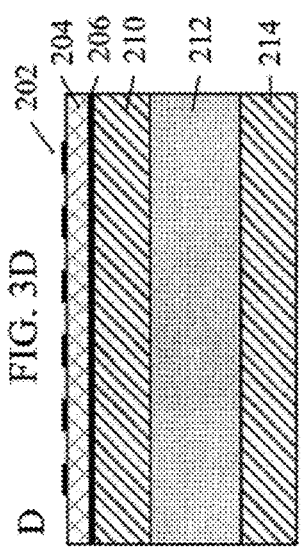

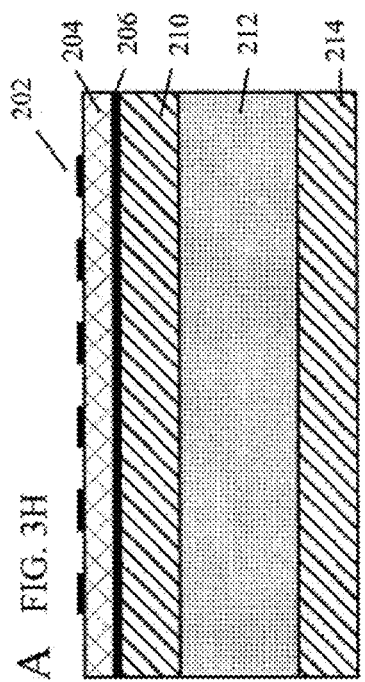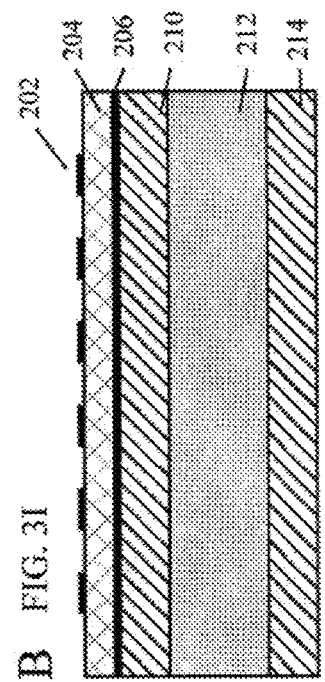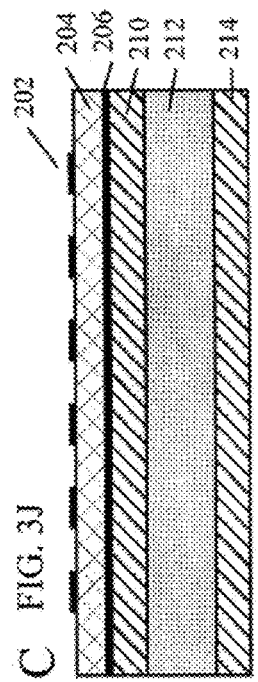

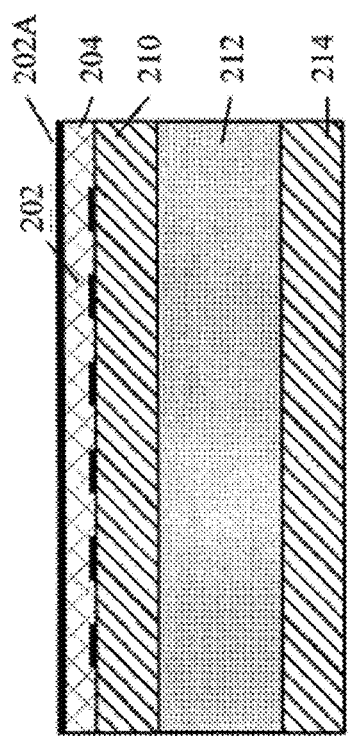
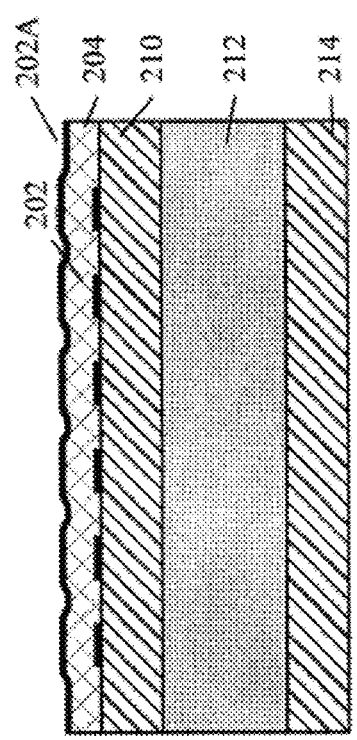
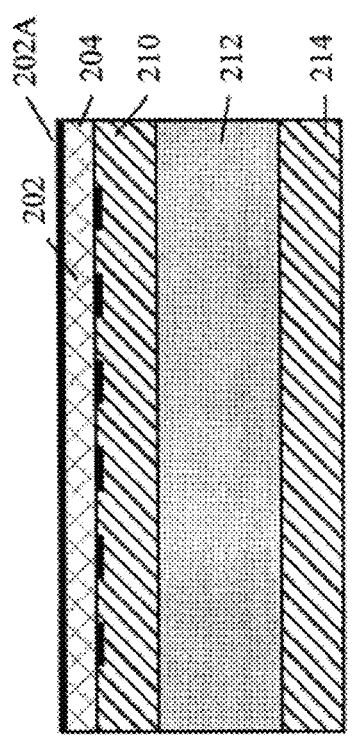
FIG. 4A
FIG. 4B
FIG. 4C

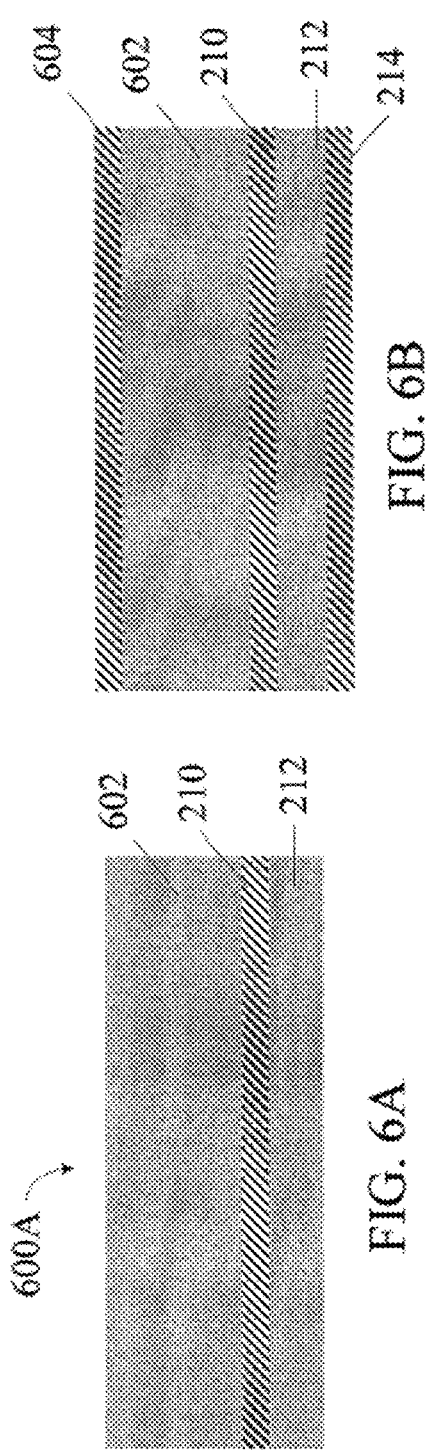
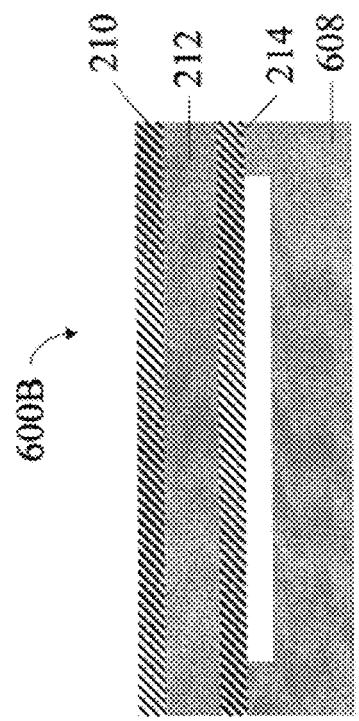
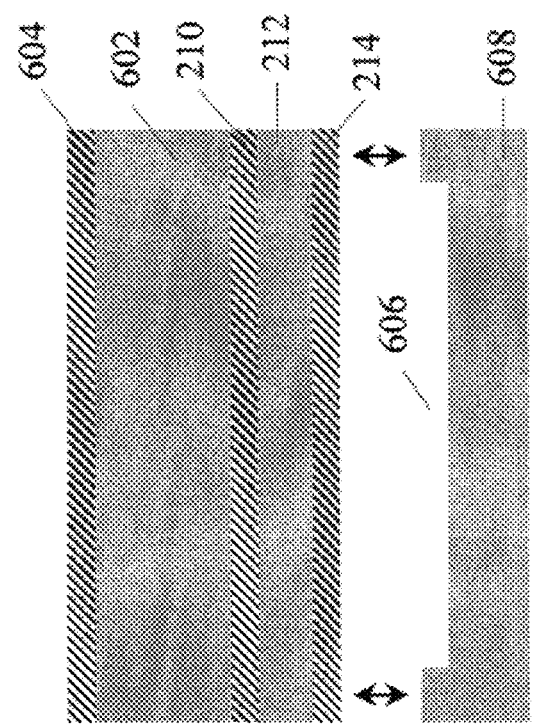
FIG. 6A
FIG. 6B
FIG. 6C
FIG. 6D

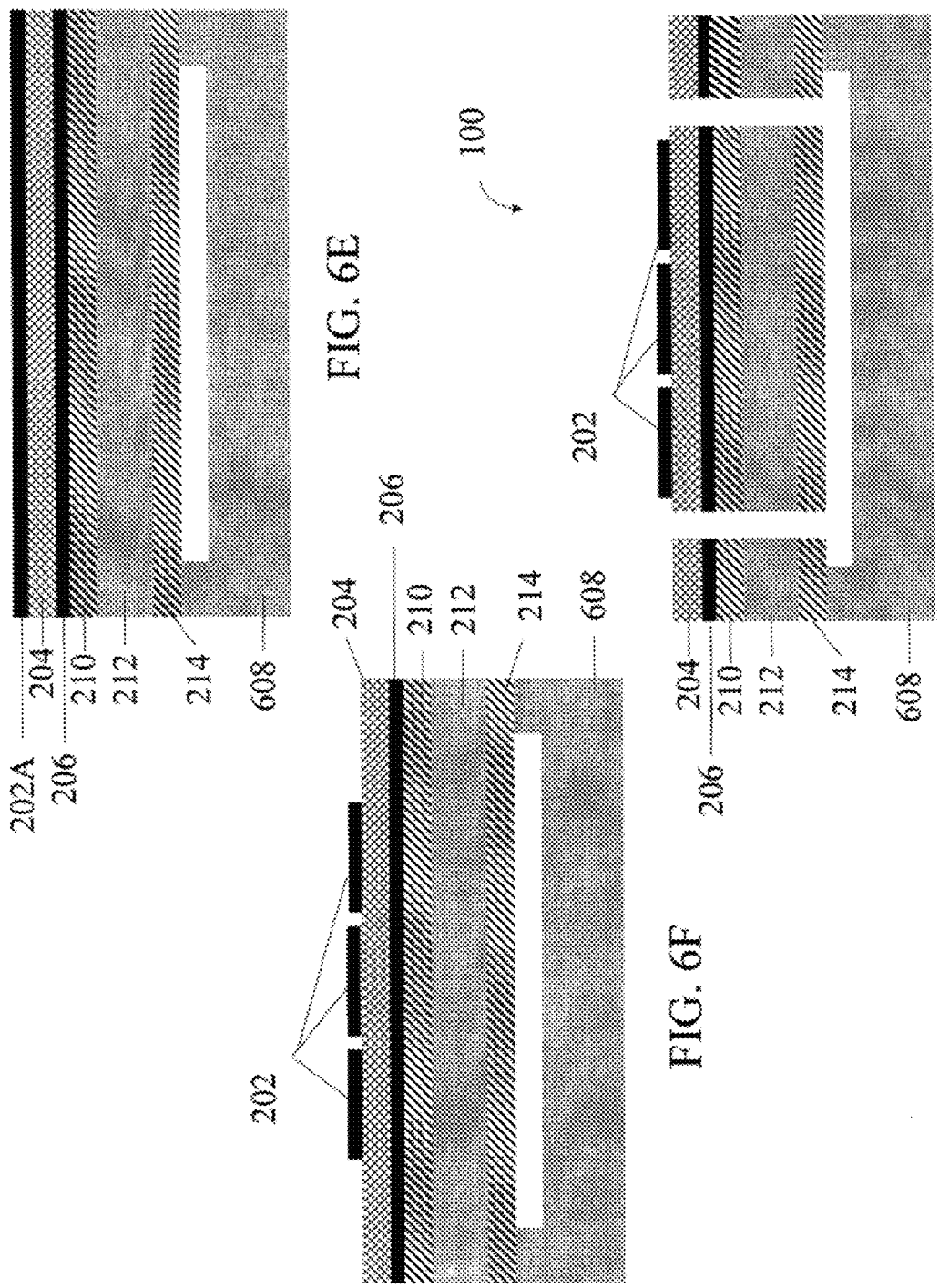

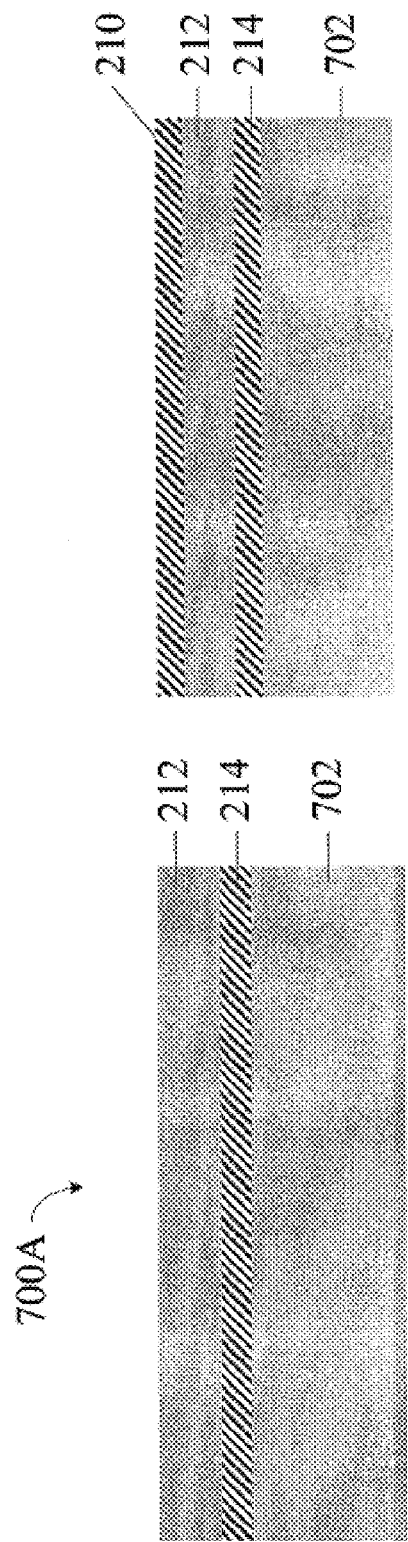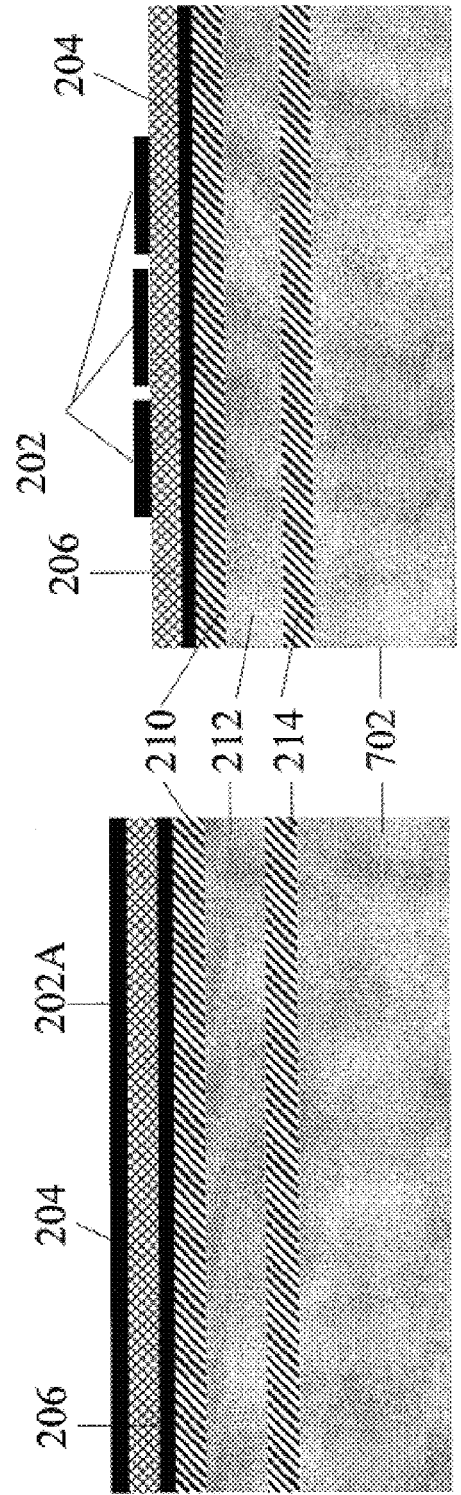

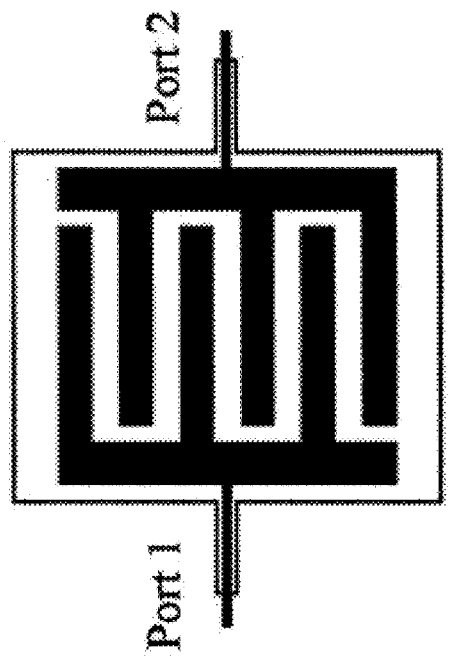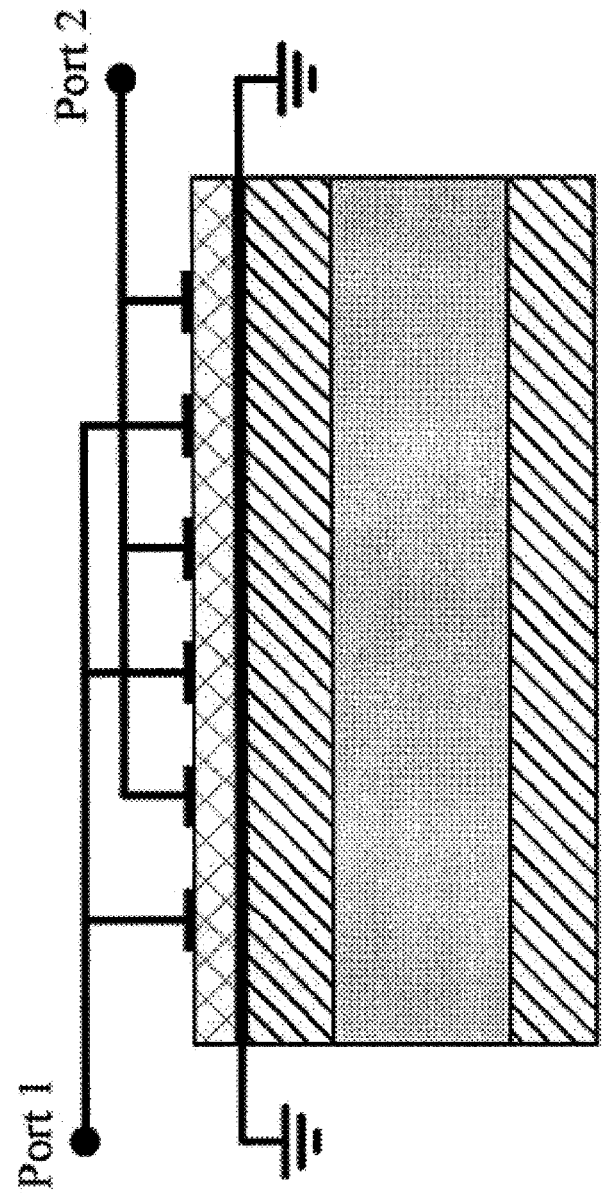
FIG. 9A
FIG. 9B

Side view of the S0 displacement

Side view of the A0 displacement

|  | Mo top | AlN top | SiO2 top | Si |
|---|---|---|---|---|
| $S_{t_{trim}}^{f_0}$ [MHz/$\mu$m] | -8.6 | 4.5 | -2.4 | 1.3 |
| $S_{t_{trim}}^{T_0}$ [MHz/$\mu$m] | -321.6 | -72.6 | 106.7 | -59.2 |
| $S_{t_{trim}}^{T_0}/S_{t_{trim}}^{f_0}$ [K/MHz] | 37.4 | -15.2 | -45.4 | -44.5 |

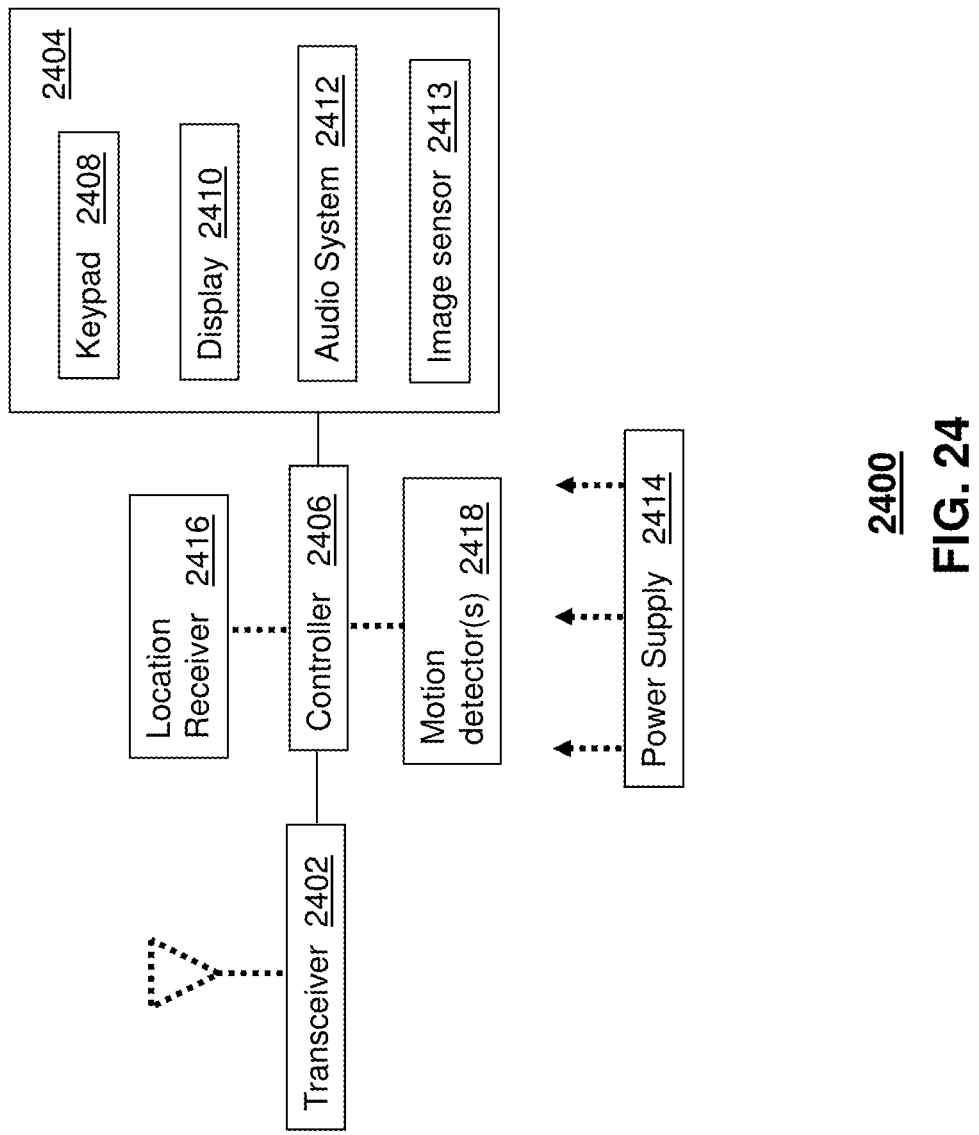

METHOD OF MANUFACTURING A MECHANICAL RESONATING STRUCTURE

PRIOR APPLICATIONS

This application is a continuation of U.S. patent application Ser. No. 13/186,428, filed Jul. 19, 2011, now U.S. Pat. No. 8,689,426, which is a continuation-in-part of U.S. application Ser. No. 12/639,161 filed Dec. 16, 2009 now U.S. Pat. No. 8,689,426, by Kuypers et al., entitled "Mechanical Resonating Structures including a Temperature Compensation Structure," which claims priority to U.S. Provisional Patent Application Ser. No. 61/138,171, filed Dec. 17, 2008 and titled "Mechanical Resonating Structures Including a Temperature Compensation Structure." All sections of the aforementioned applications are incorporated herein by reference.

FIELD OF THE DISCLOSURE

The present disclosure relates generally to mechanical resonating structures, and more particularly, to a method and apparatus for manufacturing a resonating structure.

BACKGROUND

Mechanical resonators are physical structures that are designed to vibrate at high frequencies. Such resonators may be incorporated into a variety of devices such as timing oscillators, mass sensors, gyros, accelerometers, switches, and electromagnetic fuel sensors, amongst others.

During use, mechanical resonators, and the devices which incorporate the same, may be exposed to different temperature conditions and variations. Such conditions and variations can cause material expansion and contraction, as well as changes in material stiffness. This can result in a variation in vibrational characteristics (e.g., resonating frequency) across the temperature range. These effects also can lead to increased noise, reduction in bandwidth, deterioration of signal quality and can, in general, create stability problems in devices.

The temperature stability of a mechanical resonator may be quantified as the temperature coefficient of frequency (TCF), which is expressed as: $TCF=(1/f)(\partial f/\partial T)$, where f is the resonance frequency and T is the temperature. Another term that is used to quantify the stiffness component of the temperature stability of a mechanical resonator (which is one of the primary contributors to TCF) is the temperature coefficient of stiffness (TCS), which can be expressed as: $TCS=(1/C_{\mathit{eff}})(\partial C_{\mathit{eff}}/\partial T)$, where $C_{\mathit{eff}}$ is the effective stiffness coefficient of the resonator.

To address the effects resulting from temperature change, it can be advantageous for mechanical resonating structures to have temperature compensation capabilities to improve the stability of such structures, and associated devices, over a range of temperatures.

BRIEF DESCRIPTION OF THE DRAWINGS

FIG. 3A shows a diagram of an uncompensated mechanical resonating structure with a negatively-sloped temperature coefficient of frequency.

FIG. 3B shows a diagram of a mechanical resonating structure with a negatively-sloped temperature coefficient of frequency according to embodiments of the present disclosure.

FIG. 3C shows a diagram of a mechanical resonating structure with an approximately zero temperature coefficient of frequency according to embodiments of the present disclosure.

FIG. 3D shows a diagram of a mechanical resonating structure with a positively-sloped temperature coefficient of frequency according to embodiments of the present disclosure.

FIG. 3E shows a graph of the normalized frequency variation (Δf/f) versus temperature of the mechanical resonating structures in FIGS. 3A-3D as a function of temperature according to embodiments of the present disclosure.

FIGS. 3H-3J show diagrams of mechanical resonating structures with different layer thicknesses having a zero temperature coefficient of frequency at room temperature and varying non-linear temperature coefficients of frequency according to embodiments of the present disclosure.

FIG. 4A shows a diagram of a planarized configuration of a mechanical resonating structure according to embodiments of the present disclosure.

FIG. 4B shows a diagram of a non-planarized configuration of a mechanical resonating structure according to embodiments of the present disclosure.

FIG. 4C shows a diagram of a configuration of a mechanical resonating structure according to embodiments of the present disclosure.

FIGS. 6A-6G illustrate steps for fabricating a mechanical resonating structure using a first method according to embodiments of the present disclosure.

FIGS. 7A-7F illustrate steps for fabricating a mechanical resonating structure using a second method according to embodiments of the present disclosure.

FIGS. 9A-9B illustrate a two-port mechanical resonating structure according to embodiments of the present disclosure.

FIGS. 16-17 depict a single layer technique for tuning an operational profile of a mechanical resonating structure.

FIG. 24 depicts a computing device that can utilize one or more of the mechanical resonating structures of the present disclosure.

Figure 1:
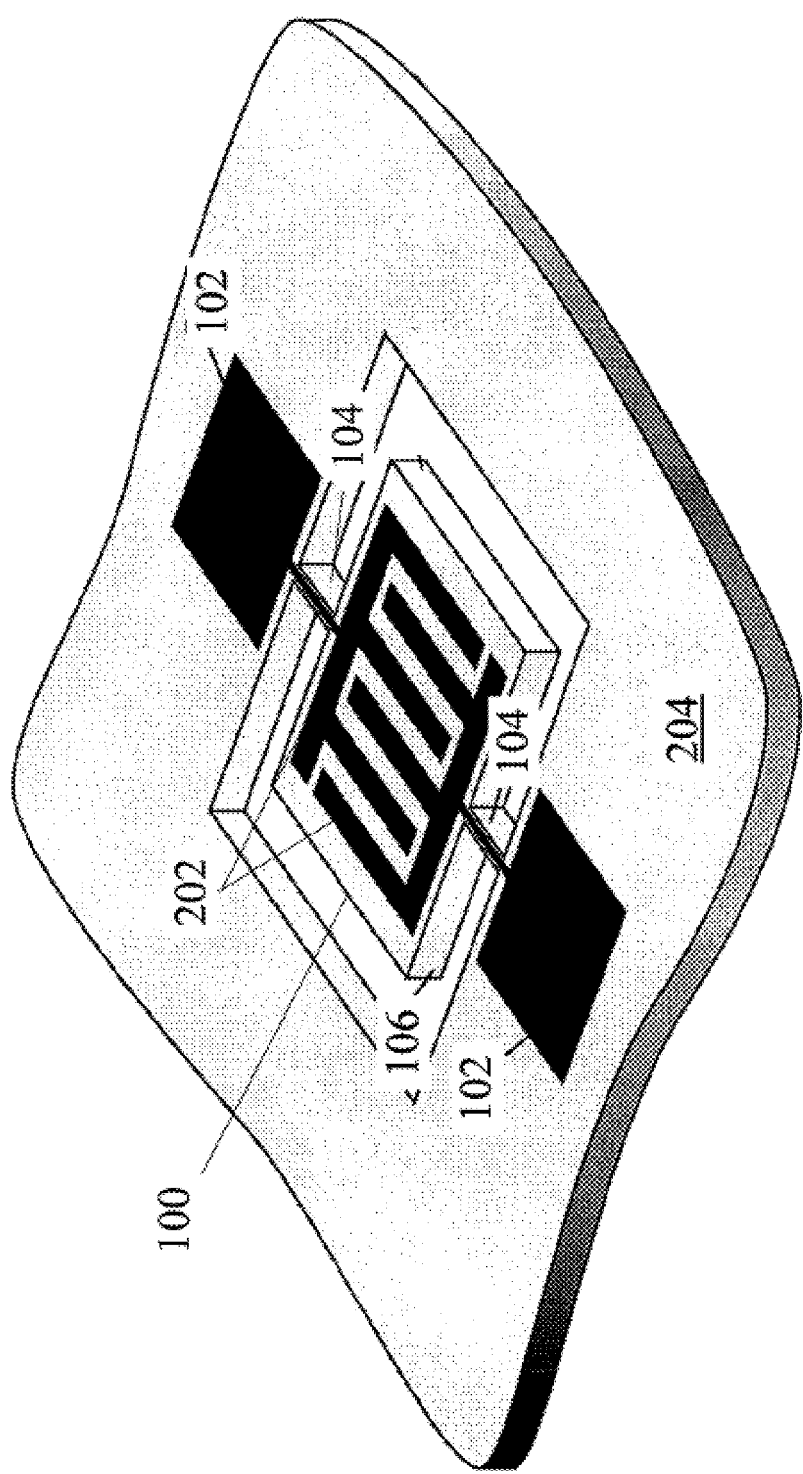
FIG. 1 shows a 3-D top view of a mechanical resonating structure according to embodiments of the present disclosure.

In the drawings, the same reference numbers identify identical or substantially similar elements or acts. The drawings illustrate particular embodiments for the purpose of describing the present disclosure, and are not intended to be exclusive or limiting in any way. The figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the present disclosure shown where illustration is not necessary to allow those of ordinary skill in the art to understand the disclosure.

In the course of the detailed description to follow, reference will be made to the attached drawings. These drawings show different aspects of the present disclosure and, where appropriate, reference numerals illustrating like structures, components, materials and/or elements in different figures are labeled similarly. It should be understood that various combinations of the structures, components, materials and/or elements, other than those specifically shown, are contemplated and are within the scope of the present disclosure.

DETAILED DESCRIPTION

Mechanical resonating structures, as well as related devices and methods, are described herein.

In one embodiment of the present disclosure, a device can have a mechanical resonating structure that includes an active layer and a compensating structure coupled to the active layer. The compensating structure can have a first layer having a stiffness that increases with increasing temperature over at least a first temperature range, a third layer having a stiffness that increases with increasing temperature over at least the first temperature range, and a second layer between the first layer and the third layer.

In another embodiment of the present disclosure, a device can have a mechanical resonating structure that includes an active layer and a compensation structure coupled to the active layer and configured to compensate temperature-induced variations in stiffness of at least the active layer. The compensation structure can have a first layer, a second layer, and a third layer. The first and third layers can be formed of a first material and the second layer can be formed of a second material different than the first material. The second layer can be disposed between the first layer and the second layer.

In one embodiment of the present disclosure, a method is provided for constructing a mechanical resonating structure by forming an active layer on a surface of a compensating structure. The compensating structure can have one or more materials having an adaptive stiffness that reduces a variance in a resonating frequency of the mechanical resonating structure as a function of temperature. The method can further include adjusting an operational profile of the mechanical resonating structure by adding one or more materials to at least a first portion of the mechanical resonating structure, removing one or more materials from at least a second portion of the mechanical resonating structure, or combinations thereof.

In one embodiment of the present disclosure, a method is provided for obtaining a mechanical resonating structure having an active layer on a surface of a compensating structure comprising one or more materials, and adjusting an operational profile of the mechanical resonating structure by adjusting a thickness of at least one of the active layer and the one or more materials of the compensating structure, wherein the one or more materials of the compensating structure have an adaptive firmness that reduces a variance in a resonating frequency of the mechanical resonating structure as a function of temperature.

In one embodiment of the present disclosure, a mechanical resonator can have an active layer, a compensating structure coupled to the active layer, and an adjustment layer coupled to one of the active layer and the compensating structure. The compensating structure can have one or more materials having a resistance to deform in response to an applied force thereby reducing a variance in a resonating frequency of the mechanical resonating structure as a function of temperature. The mechanical resonating structure can have a desired operational profile as a result of a removal of one or more materials from at least one of the active layer, the adjustment layer, and compensating structure.

Other embodiments and features of the present disclosure will become apparent from the following detailed description of the disclosure when considered in conjunction with the accompanying drawings. All patent applications and patents incorporated herein by reference are incorporated by reference in their entirety. In case of conflict, the present specification, including definitions, will control.

Mechanical resonating structures, as well as related devices and methods, are described herein. The mechanical resonating structures include an active layer comprising an active material (e.g., a piezoelectric material). For example, the active layer may be formed of a piezoelectric material. The stiffness of the active layer generally varies across the range of temperature to which the mechanical resonating structures are exposed during use. As described further below, the mechanical resonating structures include a compensating structure that can be designed to have a stiffness variation with temperature such that it balances the stiffness variation with temperature of the active layer and/or any additional layers of the mechanical resonating structure (e.g., electrode layers, support layers, or any other layers of the mechanical resonating structure) to give the mechanical resonating structure a targeted stiffness variation over the temperature range.

According to one aspect, the compensating structure can be designed such that the mechanical resonating structure has a desired frequency variation with temperature, for example by compensating for any one or more (including all) of the following: temperature-induced variations in stiffness of the materials of the mechanical resonating structure; temperature-induced expansion and/or contraction of materials; stresses caused by different coefficients of thermal expansion of different materials of the mechanical resonating structure; interfacial stresses arising from interfaces between materials of the mechanical resonating structure; stresses generated by a substrate and/or anchors connected to the mechanical resonating structure (in those embodiments in which the mechanical resonating structure is coupled to a substrate by anchors); and stresses arising from packaging of the mechanical resonating structure. For example, the compensating structure can be designed so that the resonant frequency of the mechanical resonating structure does not vary much, or at all, over a wide temperature range (e.g., TCF approaches, or is equal to 0). The compensation, thus, can significantly reduce undesirable effects that would result from such variation including a deterioration in signal quality and stability, amongst others.

FIG. 1 shows a mechanical resonating structure 100 according to an embodiment. The mechanical resonating structure is connected to pads 102 via anchors 104 according to this embodiment. As described further below, the mechanical resonating structure vibrates in response to a source of excitation (e.g., application of an electrical potential), and in some embodiments is configured (shaped, sized, etc.) to support one or more modes of Lamb waves. The mechanical vibration of the mechanical resonating structure may be converted to an electrical output signal which, for example, may be further processed. The mechanical resonating structure can generate signals with multiple modes and resonant frequencies, and, as mentioned, in some embodiments may be configured to support one or more modes of Lamb waves, although not all embodiments are limited in this respect. Typically, one of the modes can dominate and the mechanical resonating structure can vibrate at the resonant frequency associated with the dominant mode. The mechanical resonating structure can include a resonating structure plate 106 and interdigital transducer (IDT) electrodes 202. The mechanical resonating structure can include an active layer 204, as described further below.

The frequency produced by the mechanical resonating structure may vary depending on the design and application. For example, the frequency produced may be between a 1 kHz and 10 GHz. In some embodiments, for example, the frequencies are in the upper MHz range (e.g., greater than 100 MHz), or at least 1 GHz (e.g., between 1 GHz and 10 GHz). In some cases, the signal may have a frequency of at least 1 MHz (e.g., 13 MHz, 26 MHz) or, in some cases, at least 32 kHz.

The dimensions of the mechanical resonating structure depend, in part, on the desired performance including the desired frequency. According to some embodiments, the mechanical resonating structure can be a micromechanical resonator. The mechanical resonating structure may have a "large dimension" (i.e., the largest of the length, width, thickness, etc.) of less than 1 mm; in some cases, the large dimension is less than 500 micron, or less than 100 micron, or less than 10 micron.

Figure 8A:
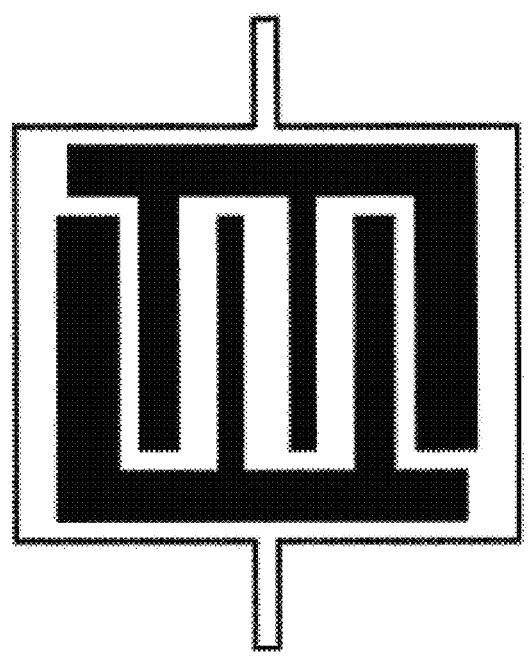
FIGS. 8A-8B show configurations of a mechanical resonating structure that suppresses spurious frequencies according to embodiments of the present disclosure.
Figure 8B:
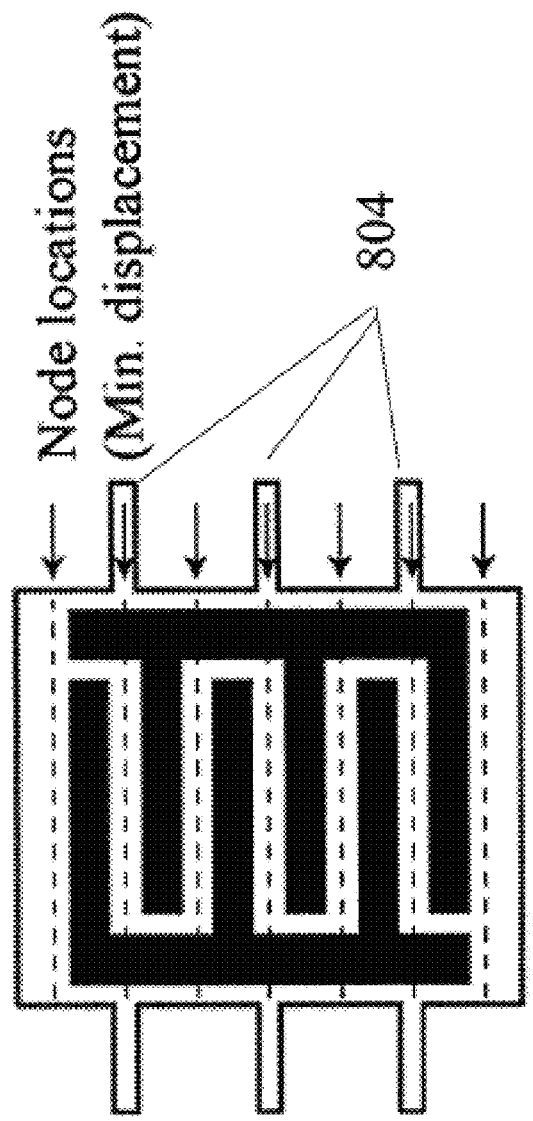

The mechanical resonating structure may have any suitable shape. For example, the configuration of the mechanical resonating structure can include, for example, any antenna type geometry, as well as beams, cantilevers, free-free bridges, free-clamped bridges, clamped-clamped bridges, discs, rings, prisms, cylinders, tubes, spheres, shells, springs, polygons, diaphragms and tori. Any of the mechanical resonating structure elements may be formed either in whole or in part of the same or different geometries. In addition, several different type geometrical structures may be coupled together to obtain particular resonance mode responses, as described further below. For example, FIG. 8A shows a mechanical resonating structure design with an IDT electrode configuration that allows reduction in coupling of spurious frequencies and their associated modes. In another example illustrated in FIG. 8B, additional anchors 804 may be added to support a mechanical resonating structure. The anchors can be placed at locations of minimum displacement (of the mechanical resonating structure), so that spurious resonator modes can be suppressed. Similarly, geometrical and structural alterations can be made to improve quality (e.g., Q-factor, noise) of the signal generated by the mechanical resonating structure.

In some embodiments, the mechanical resonating structure may include a plurality of resonating elements. At least some of the resonating elements may be coupled to one another. In some of these embodiments, the resonating elements may have different dimensions. For example, the mechanical resonating structure may include at least one major element that has a large dimension that is larger than the large dimension of the minor element. In general, the minor elements have at least one smaller dimension (e.g., length, thickness, width) than the major element. Minor elements can have a shorter length than the major element. The minor elements may have nanoscale (i.e., less than 1 micron) dimensions. In some embodiments, at least one of the dimensions is less than 1 micron; and, in some embodiments, the large dimension (i.e., the largest of the dimensions) is less than 1 micron.

Suitable mechanical resonating structures have been described, for example, in International Publication No. WO 2006/083482, U.S. patent application Ser. No. 12/181,531, filed Jul. 29, 2008, and in U.S. patent application Ser. No. 12/142,254, filed Jun. 19, 2008 and published Oct. 1, 2009 as U.S. Patent Application Publication 2009-0243747, which are incorporated herein by reference in their entireties. It should be understood that a number of different designs for the mechanical resonating structure are also suitable.

FIG. 1 also shows one configuration of IDT electrodes and the resonating structure plate according to some embodiments. Other suitable configurations of electrodes can be employed as shall be discussed in further detail below.

Figure 2A:
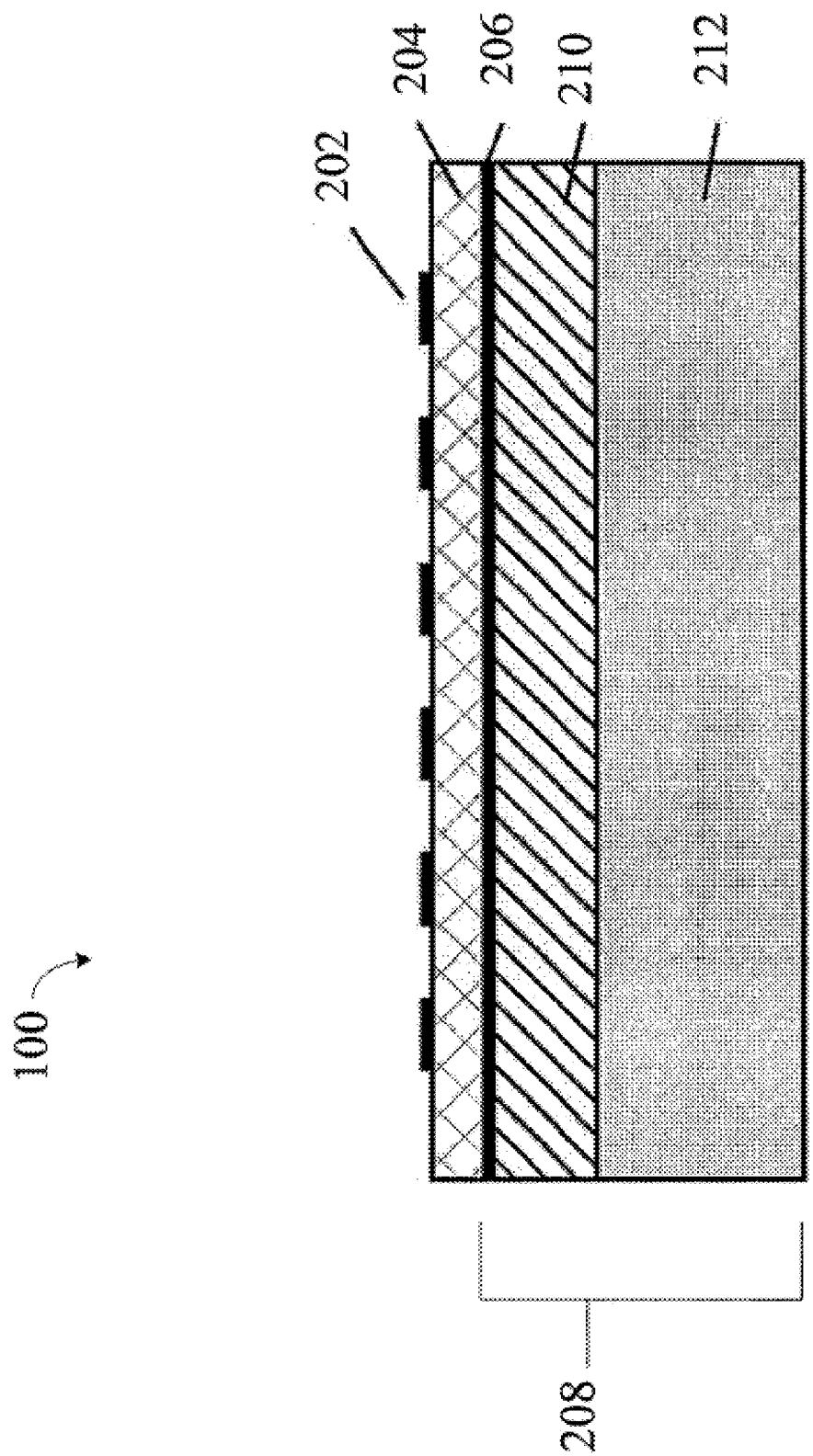
FIG. 2A shows a cross-sectional view of a mechanical resonating structure according to certain embodiments of the present disclosure.

FIG. 2A illustrates a lateral view of a mechanical resonating structure according to some embodiments. The mechanical resonating structure can be built using several components, layers, and materials including IDT electrodes 202, active layer 204, electrode layer(s) 206 and a compensating structure 208.

The active layer 204 responds to the transduction method used to actuate the mechanical resonating structure (i.e., cause to vibrate) and/or detect motion of the mechanical resonating structure. It should be understood that any transduction method may be used including piezoelectric, piezoresistive, electrostatic, electrostrictive, electromotive, magnetostrictive, magnetomotive, thermal, spin-torque effect, and spin-polarized current driven magnetic excitation, amongst others.

The active layer may have any suitable construction (including composition) which will depend, in part, on the transduction method used for actuation and/or detection. In some embodiments, the active layer is formed of a piezoelectric material. In some embodiments, the active layer is formed of a semiconductor material such as silicon. It should be understood that other compositions are also possible. In some cases, the active layer is formed of multiple layers. For example, the active layer may comprise multiple layers, one or more of which are functional (e.g., piezoelectric) and one or more of which are not.

As noted above, the active layer may be formed of a piezoelectric material. Examples of suitable materials include aluminum nitride (AlN), zinc oxide (ZnO), cadmium sulfide (CdS), quartz, lead titanate ($PbTiO_3$), lead zirconate titanate (PZT), lithium niobate ($LiNbO_3$), and lithium tantalate ($LiTaO_3$). In some embodiments, AlN may be preferred. Most active layer materials (e.g., silicon, piezoelectric materials) normally have a negative temperature coefficient of stiffness (TCS). That is, most active layer materials may become less stiff (also referred to as "softer") as temperature increases over a range. Stiffness, in general, can be associated with a resistance of a material to deform in response to an applied force.

As mentioned, according to one aspect of the present disclosure, a mechanical resonating structure may comprise a compensation structure, such as the compensation structure 208 of FIG. 2A. The compensation structure may be configured to provide a desired stiffness variation of the mechanical resonating structure and/or frequency of operation variation of the mechanical resonating structure over a desired temperature range (e.g., an anticipated operational temperature range of the mechanical resonating structure) for one or more modes of vibration of interest. In some embodiments, the composition of the active layer of the mechanical resonating structure may be considered in configuring the compensation structure, as the composition of the active layer may impact the stiffness variation of the active layer with temperature, which is to be compensated by the compensation structure in some embodiments. According to one embodiment, the compensation structure may be configured to provide the mechanical resonating structure with a TCF having an absolute value of less than approximately 1 ppm/K over a temperature range of at least 40° C. centered around room temperature (25° C.) for one or more modes of Lamb waves when the active layer is formed of aluminum nitride. However, this is merely a non-limiting example provided for purposes of illustration.

In the illustrated embodiment of FIG. 2A, active layer 204 is formed on compensation structure 208. Other configurations are also possible. For example, in some cases, the compensation structure may be formed on the active layer.

As shown, compensation structure 208 includes multiple components (e.g., layers). In general, characteristics (e.g., composition, dimensions, and arrangement within the structure) of the components (e.g., layers) are selected such that structure 208 provides the desired compensation with respect to the active layer and any additional layers to be compensated, so that the mechanical resonating structure exhibits a desired behavior across a range of temperatures for any modes of vibration of interest.

In the embodiment shown in FIG. 2A, the compensating structure includes a first layer 210 and a second layer 212. The stiffness of layers 210, 212 may vary differently with temperature. For example, layer 210 may have a stiffness that increases with increasing temperature over a temperature range (i.e., a positive TCS). Layer 212 may have a stiffness that decreases, or stays relatively constant, with increasing temperature over a temperature range (i.e., a negative TCS). As described further below, the arrangement of the first and second layers (e.g., dimensions, location within structure) may be selected to impart the mechanical resonating structures with desired behavior across a range of temperatures. For example, the arrangement may be selected so that the resonating structures have a relatively constant stiffness over a temperature range. That is, the TCS may approach or be equal to 0. This may contribute to minimizing the frequency variation over the temperature range (e.g., TCF may approach or be equal to 0). Thus, it should be appreciated that in some embodiments the temperature compensation structure may compensate for temperature-induced variations in stiffness of layers other than the active layer (but in addition to the active layer in some embodiments) of the mechanical resonating structure, e.g., one layer of the temperature compensation structure may compensate for temperature-induced stiffness variations of another layer of the temperature compensation structure.

It should be understood that, in certain embodiments, the compensating structure may include one or more layers in addition to those shown in FIG. 2A. Some of these embodiments are described further below. The additional layer(s) may have the same composition as one of the first or second layers. In other embodiments, the additional layer(s) may have a different compensation than both the first and second layers.

In some embodiments, the compensation structure may be formed of only a single layer (e.g., first layer 210). In one such embodiment, for example, the active layer may be formed of silicon and the single layer of the compensation structure may be formed of $SiO_2$. In an alternative such embodiment, the active layer may be formed of aluminum nitride (AlN) and the single layer of the compensation structure may be formed of silicon dioxide ($SiO_2$). Other choices for the materials may also be used.

The first layer can have characteristics that are selected so that it has a positive TCS (i.e., TCS>0) over a temperature range. For example, the composition of the first layer may be selected to provide a positive TCS. Suitable compositions can include $SiO_2$ and $Al_2O_3$, amongst others. In some cases, $SiO_2$ may be preferred. In some cases, the first layer may be composed of a series of ultra-thin layers (e.g., less than 10 nm thick) which are combined to produce an overall layer having a positive TCS. The positive TCS may also, or alternatively, be engineered by implanting species (e.g., ions, neutrons) into the first layer. Thus, it should be understood that a layer exhibiting a positive TCS may be obtained in any of a number of suitable ways, and that the various aspects described herein including one or more layers exhibiting a positive TCS are not limited in the manner in which the positive TCS is obtained.

As noted above, first layer 210 can have a positive TCS over a temperature range. In some cases, the TCS is positive across the entire operating temperature range of the device. For example, the TCS may be positive across the temperature range of between −55° C. and 150° C., or between −40° C. and 85° C. However, in other cases, the TCS of first layer 210 may be positive across a portion of the operating range, and negative across other portion(s). The TCS of the first layer may be positive across the majority of the temperature range. In some embodiments, the TCS of the first layer may be positive across a range of at least 200° C.; in some embodiments, at least 100° C.; and, in other embodiments, at least 50° C.

As noted above, second layer 212 may have a different stiffness-temperature dependence than the first layer. The second layer may be a support layer that provides robustness to the first layer. The second layer may be formed of a material having a lower acoustical loss than the material of the first layer. In some embodiments, the second layer is formed of a material having a certain crystal structure. For example, the second layer may be formed of a single crystal material and/or a material having higher crystal quality than the material of the first layer (e.g., lower defects). In particular, when the first layer comprises $SiO_2$, the robustness and support provided by the second layer is useful, since a structure comprised of a thin $SiO_2$ layer(s) and the active layer can be fragile and prone to damage if subjected to forceful mechanical movements or vibrations. The second layer can also provide improved signal performance (e.g., less noise and better Q-factor). Suitable materials for second layer 212 include silicon, diamond, silicon carbide, sapphire, quartz, germanium, aluminum nitride, and gallium arsenide, amongst others. In some embodiments, it is preferable for the second layer to be formed of silicon.

The embodiment of FIG. 2A includes IDT electrodes 202 and an electrode layer 206 to facilitate transfer of charges and electric potential across a mechanical resonating structure. The number of electrodes and placement of electrodes can be important as they can determine the types of acoustic waves and excitation modes generated by the mechanical resonating structure's motion.

Examples of suitable electrode materials include, but are not limited to, aluminum (Al), molybdenum (Mo), titanium (Ti), chromium (Cr), ruthenium (Ru), gold (Au), platinum (Pt) or AlSiCu. In general, any suitable electrode material can be utilized for the electrode layer. In some embodiments, a thin layer of Ti and/or AlN may be added beneath the electrode to enhance crystal orientation of the active (e.g., piezoelectric) material layer.

Figure 2B:
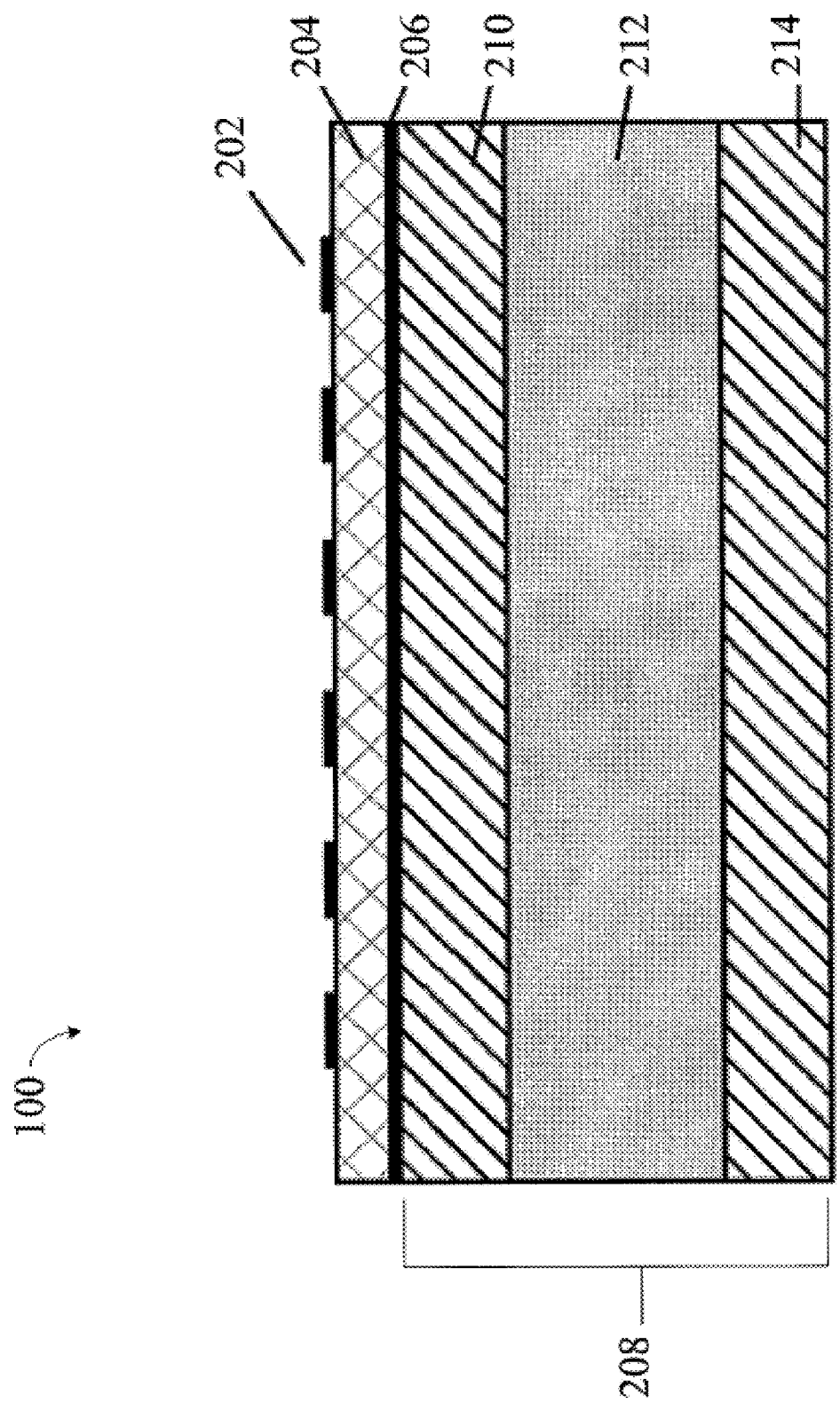
FIG. 2B shows a cross-sectional view of a mechanical resonating structure according to certain embodiments of the present disclosure.

FIG. 2B illustrates another embodiment in which the compensating structure includes a third layer 214. In some cases, the third layer may be formed of a material having a positive TCS. Suitable materials having a positive TCS were described above in connection with first layer 210. In some embodiments, the third layer comprises the same material as first layer 210. However, in other embodiments, the third layer may comprise a different material than the first layer (and the second layer). In some embodiments, layers 210 and 214 are formed of $SiO_2$ layers. In some of these cases, the second layer 212 is formed of Si. As shown, the second layer is positioned between the first layer and the third layer. Other arrangements are possible.

In some embodiments, the third layer has a similar thickness as the first layer. For example, the ratio of the thickness of the third layer to the thickness of the first layer may be between 1:0.25 and 1:4.0, between 1:0.75 and 1:1.25, or about 1:1. For example, the listed ratios may be suitable when the third layer is formed of the same composition as the first layer (e.g., when the first and third layers are both formed of $SiO_2$, or any other suitable material (e.g., any other suitable positive TCS material)).

In some cases, the three-layer compensation structure configuration illustrated in FIG. 2B may provide enhanced performance as compared to a two-layer compensating structure. For example, such a configuration can reduce the tendency of the resonating structure to bend out of plane by balancing residual stress in the structure. This can provide a high Q, low noise signal. In some embodiments, a split-layer compensation structure similar to that illustrated in FIG. 2B may facilitate fabrication of the structure. For example, as mentioned, in one embodiment the layers 210 and 214 may be formed of the same material (e.g., $SiO_2$). Rather than forming a single layer of the material having a thickness approximately equal to the combined thickness of layers 210 and 214, the configuration of FIG. 2B may be used in which separate layers 210 and 214 are formed. In this manner, fabrication defects associated with forming thick material layers (e.g., cracking, bending, warping, etc.) may be minimized or avoided, as may be out-of-plane deformation of the mechanical resonating structure.

It should be understood that the compensation structure may have a variety of different configurations in addition to those shown in FIGS. 2A and 2B. For example, the compensation structure may include more than three layers. In some cases, the compensation structure may include at least one additional layer having a similar function as second layer 212 described above. The additional one or more layer(s) may be formed of a material having a lower acoustical loss than the material of the first layer including those noted above. In some cases, the additional one or more layer(s) is formed of silicon. As noted above, the compensation structures can be designed to provide the mechanical resonating structure with a desired frequency variation with temperature (e.g., TCF) for one or more modes of interest. In some embodiments, it may be desirable for the TCF to approximate or be equal to zero over a range of temperatures for one or more modes of Lamb waves, or for any other modes of interest. That is, in these cases, the compensating structure can enable the mechanical resonating structure to operate with little or no variation in frequency over a range of temperatures.

However, in some embodiments, it may be desirable for the TCF to be non-zero at least over certain temperature ranges. Thus, in these cases, the frequency of the mechanical resonating structure may vary a desired amount with temperature. In these embodiments, the compensation structure is designed to achieve the desired amount of variation.

In some embodiments, the mechanical resonating structure has an absolute value of a TCF of less than 10 ppm/K over a range of temperatures. For example, the absolute value of the TCF may be less than 10 over an anticipated operating range of the mechanical resonating structure (e.g., from −40° C. to 85° C.). In some embodiments, the absolute value of the TCF is less than 6 ppm/K over a range of temperatures, for example from −40° C. to 85° C. In some embodiments, the absolute value of the TCF over the range of temperatures (e.g., from −40° C. to 85° C.) is less than 5 ppm/K, or less than 3 ppm/K, less than 2 ppm/K or less than 1 ppm/K. In some cases, the TCF may approximately equal 0 (which includes exactly equaling zero) over a range of at least 5° C. or at least 10° C. within the range from −40° C. to 85° C., as a non-limiting example. Other values are also possible. For example, in some embodiments the absolute value of the TCF may be less than 4 ppm/K, less than 1 ppm/K, less than 0.5 ppm/k, or approximately zero, over a range of temperature spanning at least 40° C. (e.g., a range of temperatures spanning at least 40° C. and centered approximately at room temperature, 25° C.).

The range of temperatures over which the desired TCF is achieved may depend on the application. In some cases, the temperature range may be broad. For example, the temperature range may be between −55° C. and 150° C.; or, −40° C. to 85° C. The range may span at least 200° C., at least 100° C., at least 75° C., at least 50° C., or at least 40° C. In other embodiments, the range of temperature over which the desired TCF is achieved may be more narrow. For example, the temperature range may be less than 50° C., less than 25° C., or less than 10° C. In general, the above-noted ranges of temperatures can be centered around any desired temperature. For example, they may be centered around room temperature (i.e., 25° C.), an elevated temperature such as 100° C., or otherwise.

The compensation structure may be designed to result in a mechanical resonating structure with a desired TCF by selecting appropriate characteristics for the compensation structure. For example, the characteristics may include the composition, dimensions, and arrangement of layers within the structure.

In some embodiments, there may be a desired thickness ratio between layers in the structure. In some cases, the thickness of the active layer (e.g., layer 204) and the total thickness of the positive TCS material layer(s) (e.g., layer 210 in FIG. 2A and layers 210, 214 in FIG. 2B) may be selected to provide a desired ratio. The ratio of the thickness of the active layer to the total thickness of the positive TCS material layer(s) may be between 1:1 and 1:500, or between 1:1 and 1:200 in some non-limiting embodiments. In some embodiments, the ratio may be between 1:1 and 1:10, or between 1:4 and 1:8, or between 1:5 and 1:7 (e.g., about 1:6). In some such embodiments, the active layer may be formed of aluminum nitride and the positive TCS material of the compensation structure may be formed of silicon dioxide, although other materials may be used for the active layer and positive TCS material layer, as those listed are merely examples. In embodiments which include more than one layer formed of a positive TCS material, the total thickness of the positive TCS material layer(s) includes the sum of the thickness of all such layers. In embodiments which include a single layer formed of a positive TCS material, the total thickness of the positive TCS material layer(s) is the thickness of that single layer. The above-noted ratios, for example, may be suitable when the positive TCS material in the layer(s) is $SiO_2$ and the active material is a piezoelectric material such as AlN. Other ratios may be suitable depending on the materials used.

In some cases, the thickness of the positive TCS material layer(s) and the thickness of the layer(s) having a lower acoustic loss than the positive TCS material layer(s) (e.g., layer 212) are selected to provide a desired ratio. For example, the ratio of the total thickness of the positive TCS material layer(s) (e.g., the combined thickness of multiple positive TCS layers in those embodiments in which the compensation structure includes multiple positive TCS layers) and the layer(s) having a lower acoustic loss than the positive TCS material layer(s), may be between 1:0.1 and 1:10, 1:0.5 and 1:3, between 1:0.75 and 1:1.25, or between 1:1 and 1:2. The above-noted ratios may be suitable when, for example, the positive TCS material in the layer(s) is $SiO_2$ and the layer(s) having a lower acoustic loss than the positive TCS material layer(s) is/are formed of Si. These ratios may be suitable when the active material is a piezoelectric material such as AlN.

According to some embodiments, the ratio of the thickness of the active layer(s) of the mechanical resonating structure compared to the thickness of any layers of the temperature compensation structure having lower acoustic loss (e.g., layer 212) may be designed to fall within certain ranges. For example, according to one embodiment the ratio of the thickness of the active layer to the total thickness of one or more layers of the temperature compensation structure having lower acoustic loss than the positive TCS layer(s) may be between 1:0.1 and 1:500, and in some embodiments may be between 1:0.5 and 1:20. Such ratios may be suitable when the active layer comprises, for example, AlN, and the layer of lower acoustic loss material comprises, for example, silicon. Other materials and other ratios may be used, however, as those listed are not limiting.

It should be understood that certain embodiments may include layer thicknesses outside of the above-noted ranges.

FIGS. 2-3D and FIGS. 3H-3J illustrate some embodiments of the present disclosure. Other configurations of a mechanical resonating structure can be utilized. For example, FIGS. 4A-4C illustrate 3 different configurations of a mechanical resonating structure. As shown in FIG. 4A, a top electrode 202A can be placed on top of active layer 204 (e.g., AlN). The compensating structure can be situated below the active layer with IDT electrodes 202 located at an interface of the compensating structure and the active layer. The compensating structure can be a Si layer 212 placed between two $SiO_2$ layers 210, 214 of equal thickness. FIG. 4A illustrates a configuration in which the IDT electrodes are not placed on the top surface of the mechanical resonating structure and in which the active layer is planarized. In contrast, FIG. 4B illustrates a similar structure to FIG. 4A with a difference that the top electrode and active layer are not planarized. FIG. 4C also illustrates a configuration similar to FIG. 4A; however, in contrast to FIG. 4A, the IDT electrodes in FIG. 4C are embedded in a first $SiO_2$ layer of the compensating structure.

Figure 5A:
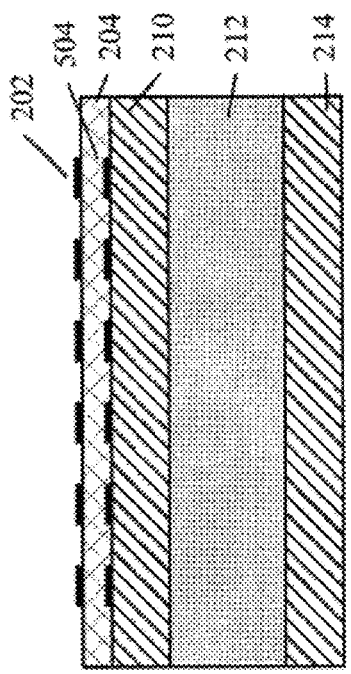
FIG. 5A shows a diagram of a planarized configuration of a mechanical resonating structure with top and bottom electrodes according to embodiments of the present disclosure.
Figure 5B:
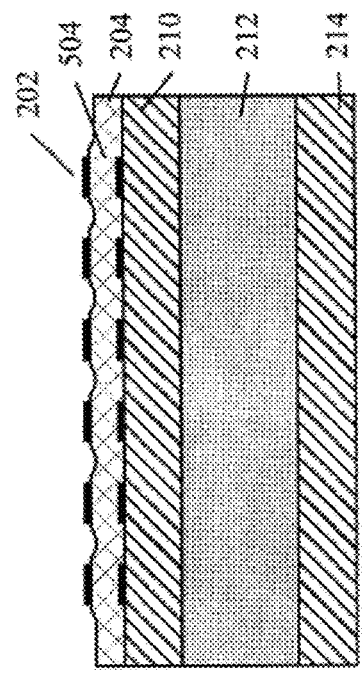
FIG. 5B shows a diagram of a non-planarized configuration of a mechanical resonating structure with top and bottom electrodes according to embodiments of the present disclosure.
Figure 5C:
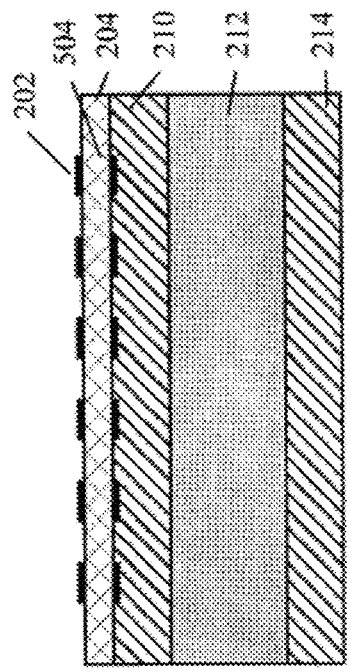
FIG. 5C shows a diagram of a configuration of a mechanical resonating structure with top and bottom electrodes according to embodiments of the present disclosure.

FIGS. 5A-5C illustrate another set of embodiments in which top 202 and bottom 504 IDT electrodes are used in a mechanical resonating structure. For example, in FIG. 5A, bottom electrodes are placed within the active layer 204 at an interface with the compensating structure as in FIGS. 4A and 4B. However, an additional set of top IDT electrodes are deposited on the top surface of the active layer. FIG. 5B illustrates a non-planarized structure as compared to the planarized structured in FIG. 5A. FIG. 5C shows the bottom IDT electrodes being situated within the first $SiO_2$ layer 210 of the compensating structure. As can be appreciated from the descriptions of FIGS. 4A-5C, various configurations of a mechanical resonating structure with zero TCS can be designed and utilized.

A mechanical resonating structure can be manufactured using simple fabrication processes. As an example, FIGS. 6A-6G and FIGS. 7A-7F illustrate two possible processes used to fabricate a mechanical resonating structure according to embodiments of the present disclosure. It should be understood that other fabrication techniques are also possible including techniques in which the specific process steps are re-arranged in a different order.

A first fabrication process is shown in FIGS. 6A-6G. Structure 600A, including a handle layer 602, a first layer 210 with a stiffness that increases with temperature (e.g., $SiO_2$ or any suitable oxide layer), and a second layer 212 with a stiffness that decreases with temperature (e.g., Si), can be used to commence the fabrication process. As shown in FIG. 6A, the first layer can be buried between the handle layer and the second layer. In some embodiments, the handle and second layers can be Si layers.

Next, as shown in FIG. 6B, thermal oxide layers 604, 214 can be formed on a top surface of the handle layer and a bottom surface of the second layer using a suitable thermal oxidation procedure. The added thermal oxide layers can be similar to a thickness of the buried first layer 210. Subsequently, a wafer 608 with cavity 606 can be bonded to structure 600A, as illustrated in FIG. 6C. Bonding the wafer to structure 600A yields a modified structure 600B with a pre-defined cavity. Subsequently, as illustrated in FIG. 6D, the handle layer 602 and oxide layer 604 can be removed and a planarized top first layer may be formed using any suitable planarization procedure (e.g., chemical mechanical planarization (CMP). After the planarization process, a bottom electrode layer 206, an active layer 204 and a top electrode layer 202A can be deposited on the top, planarized surface of first layer 210 (FIG. 6E). Suitable deposition techniques include, for example, chemical vapor deposition (CVD) and physical vapor deposition (PVD). In general, any suitable deposition technique can be used. Portions of the top electrode layer can then be selectively removed using any suitable photolithography process. The selective removal can result in formation of IDT electrodes 202 as shown in FIG. 6F. As a next step, the active layer, the electrode layer, the first layer, the second layer and the oxide layer can be etched until the cavity is reached to yield a suspended resonating structure 100 as shown in FIG. 6G. Anchors and other components (e.g., pads, vias) compensating the suspended resonating structure are not shown in FIG. 6G.

Figure 7E:
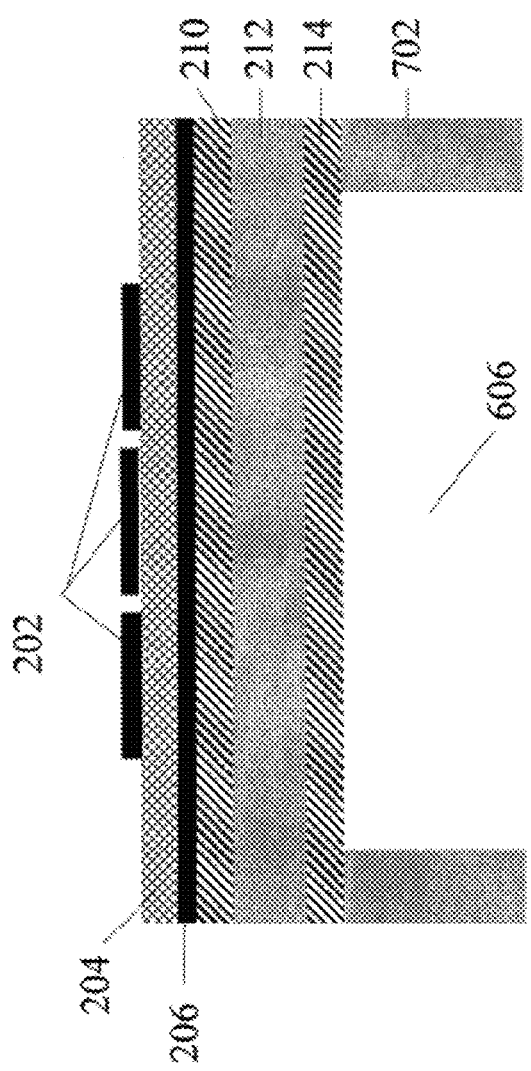
Figure 7F:
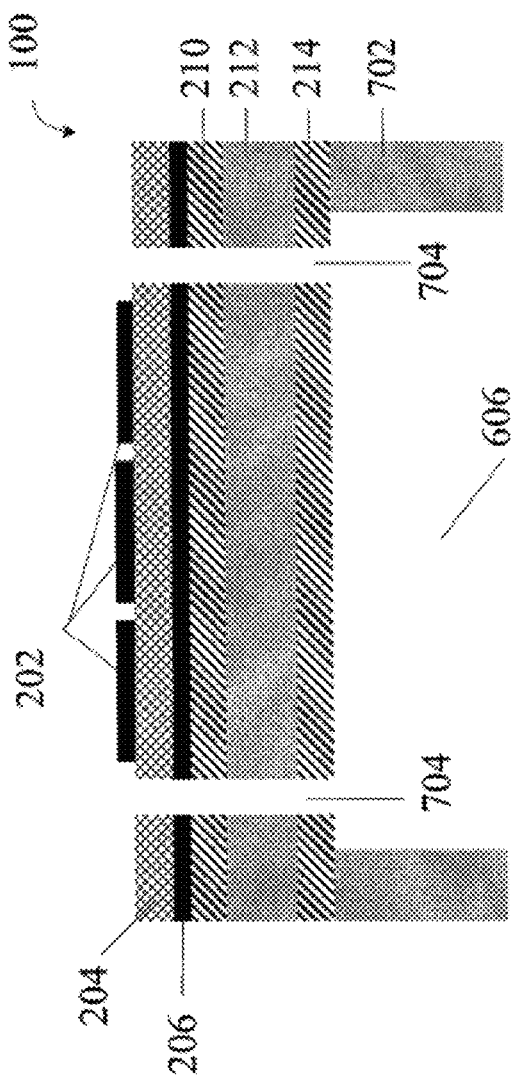

FIGS. 7A-7F illustrate another process that can be used to fabricate a mechanical resonating structure according to some embodiments Like the first process, a structure 700A with a handle layer 702, an oxide layer 214 and a second layer 212 with a stiffness that decreases with temperature (e.g., Si) can be used to commence the fabrication process. A first layer 210 with a stiffness that increases with temperature (e.g., $SiO_2$ or any suitable oxide layer), a bottom electrode layer 206, an active layer 204 and a top electrode layer 202A can be deposited on the second layer as shown in FIGS. 7B and 7C. The first layer 210 can have the same thickness as oxide layer 214. Examples of suitable deposition techniques have been described above. Subsequently, the top electrode layer is partially removed to form IDT electrodes 202 as described above and shown in FIG. 7D. Using a bottom-up dry or wet etch process, the handle layer is selectively etched to the bottom surface of oxide layer 214 to form a cavity 606 as shown in FIG. 7E. Further etching 704 of the active layer, the bottom electrode layer, the second layer, the first layer and the oxide layer can result in a suspended resonating structure 100 illustrated in FIG. 7F.

It should be understood that other configurations and/or fabrication processes can be used for a mechanical resonating structure.

The mechanical resonating structures described herein can be incorporated into a variety of devices. According to some embodiments, a mechanical resonating structure can be integrated in tunable meters, mass sensors, gyros, accelerometers, switches, and electromagnetic fuel sensors. According to some embodiments, the mechanical resonating structure can be integrated in a timing oscillator. Timing oscillators can be used in several devices including digital clocks, radios, computers, oscilloscopes, signal generators, and cell phones. Timing oscillators can precisely generate clock signals, for example, as a reference frequency to help synchronize other signals that are received, processed, or transmitted by a device in which the timing oscillator is integrated. In some scenarios, multiple processes are run simultaneously on a device and the execution of such processes rely on a clock signal that can be generated by the mechanical resonating structure. According to some embodiments, a mechanical resonating structure can also be coupled to additional circuitry. For example, additional circuitry may include filters, mixers, dividers, amplifiers or other application specific components and devices.

In some embodiments, the mechanical resonating structure can be used as a multiple port device. For example, as illustrated in FIGS. 9A and 9B, the bottom electrode can be grounded, while the IDT electrodes are coupled to two ports, namely Port 1 and Port 2. Alternatively, the bottom electrode could be a floating node. In another example illustrated in FIGS. 10A and 10B, a dual mechanical resonating structure can be utilized to create a four-port mechanical resonating structure device. In the dual mechanical resonating structure configuration, two mechanical resonating structures can be implemented on the same resonating structure plate and the ports can be connected to the desired inputs and outputs.

The following example is provided for illustration purposes and is not intended to be limiting.

The following is an example that illustrates that the TCF of a mechanical resonating structure can be controlled according to the methods described herein with reference to FIGS. 3A-3J. In this example, layers 210, 214 are formed of $SiO_2$ and layer 212 is formed of Si.

FIG. 3E is an indicator of how the TCF varies as a function of temperature. Specifically, FIG. 3E shows a graph of the normalized frequency variation ($\Delta f/f$) versus temperature. The TCF corresponds to the slope of this curve. As noted above, the active layer can have a negative TCF, and $SiO_2$ can have a positive TCF for a specified range of temperatures.

FIG. 3A shows an example of a mechanical resonating structure with an active layer (e.g., AlN), a bottom electrode, a Si layer 212 and no $SiO_2$ layers. This structure has a negative TCF of approximately −30 ppm/K (illustrated by line A in FIG. 3E). FIG. 3B shows an example of a mechanical resonating structure with a Si layer placed between two $SiO_2$ layers as discussed above. The $SiO_2$ layers have a relatively small thickness compared to the Si layer and to corresponding $SiO_2$ layers in FIGS. 3B and 3C. As illustrated by line B in FIG. 3E, the low thickness can result in a TCF that is still negative but greater (i.e., less negative) than the TCF of the mechanical resonating structure in FIG. 3A. The structure shown in FIG. 3C is similar to the mechanical resonating structure in FIG. 3B; however, in FIG. 3C, both $SiO_2$ layers have greater thicknesses. The corresponding line, C, in FIG. 3E indicates an almost zero TCF for the mechanical resonating structure in FIG. 3C. If the thickness of the $SiO_2$ layers is further increased, as shown in FIG. 3D, then the TCF of the mechanical resonating structure becomes non-zero and positive, as shown by D in FIG. 3E. Accordingly, in these embodiments, the thinner the thickness of the $SiO_2$ layers, the more negative the TCF of the mechanical resonating structure.

Figure 3F:
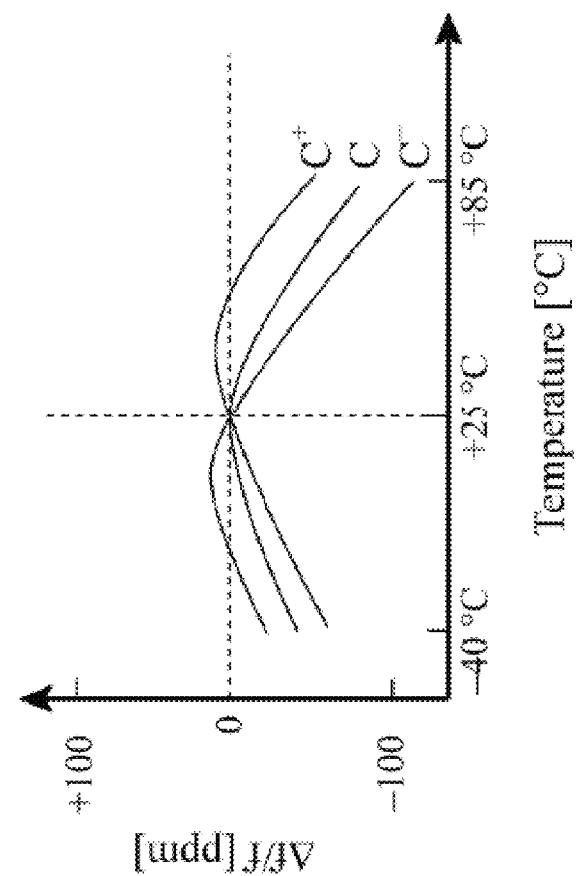
FIG. 3F shows a graph of a mechanical resonating structures' non-linear temperature coefficient of frequency behavior according to embodiments of the present disclosure.

While FIG. 3E illustrates an example of how the normalized frequency variation ($\Delta f/f$) over temperature can be 'leveled' and, therefore, the TCF approaches zero over a range of temperatures by selecting appropriate thicknesses for layers of a mechanical resonating structure device, in certain cases it may be more challenging to achieve a flat response over a broad range of temperatures (e.g., −40° C. to 85° C.), since many materials have non-linear TCF properties. For example, some materials may have higher order TCF properties. For such materials, the mechanical resonating structure may be designed and/or tuned to provide zero TCF properties around the operating temperature (e.g., room temperature) or any other desired/pre-determined temperature of the mechanical resonating structure. For example, as illustrated in FIG. 3F, a non-linear curve C can have a zero TCF at room temperature (i.e., 25° C.) if suitable thicknesses are chosen for the mechanical resonating structure layers. If, for example, a slightly thicker $SiO_2$ layer is used, a zero TCF can be achieved at a temperature greater than room temperature, as indicated by curve $C^+$; however, if a slightly thinner $SiO_2$ layer is used, a zero TCF can be achieved at a temperature lower than room temperature, as indicated by curve $C^-$.

Figure 3G:
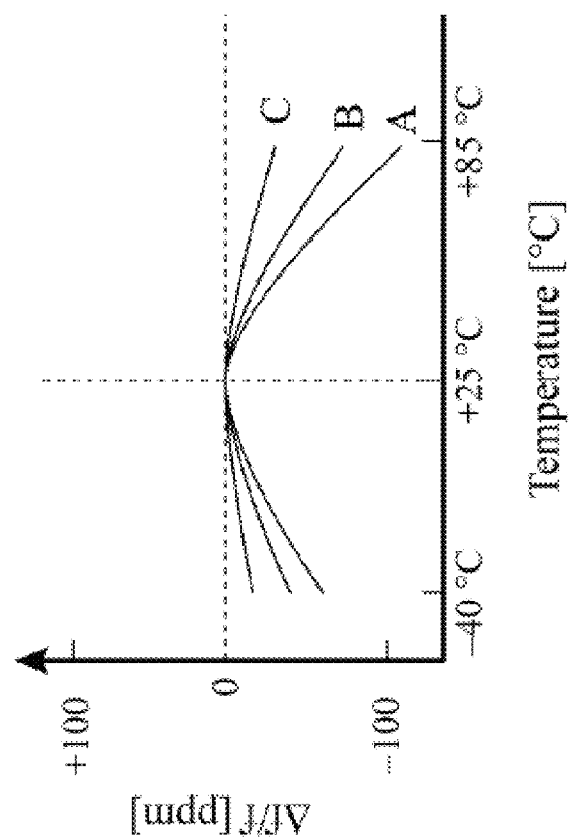
FIG. 3G shows a graph of a mechanical resonating structures' non-linear temperature coefficient of frequency behavior where all the structures have a zero temperature coefficient of frequency at room temperature according to embodiments of the present disclosure.

The thicknesses of the mechanical resonating structure layers may not only determine where a zero TCF is achieved in a broad range of temperatures, but may also help reduce the higher-order nature of the mechanical resonating structure layers' non-linear TCF properties. FIG. 3G, for example, shows the parabolic TCF profile of three mechanical resonating structures A, B and C illustrated in FIGS. 3H-3J. Structure C has a smaller Si/SiO$_2$ layer thickness than structure B, which has a smaller Si/SiO$_2$ layer thickness than structure A. Due to differences in a ratio of the thickness of the active material to the thickness of the Si layer and/or the SiO$_2$ layers, the parabolic profile of all three structures can be different despite having a zero TCF at room temperature. For example, as shown in FIG. 3G, since structure A has the thickest SiO$_2$ layers, structure A maintains its higher order characteristic with a severely parabolic TCF profile as shown by curve A. In comparison, curve B has a less parabolic TCF profile. Curve B corresponds to structure B, which has smaller SiO$_2$ layer thickness than structure A. Similarly, as shown by curve C, structure C has the least parabolic TCF profile since structure C has the thinnest SiO$_2$ layers.

It is possible for the ratio of the thickness of the active material to the thickness of the Si layer and/or the SiO$_2$ layers to vary during the manufacturing process of mechanical resonating structures. Variances in thickness ratios can result in a mechanical resonating structure having a zero TCF that is offset from room temperature such as curves C$^+$ and C$^-$ of FIG. 3F, and/or has a severe parabolic TCF profile such as curve A of FIG. 3G.

Modes of Operation of the Mechanical Resonating Structure

Figure 11A:
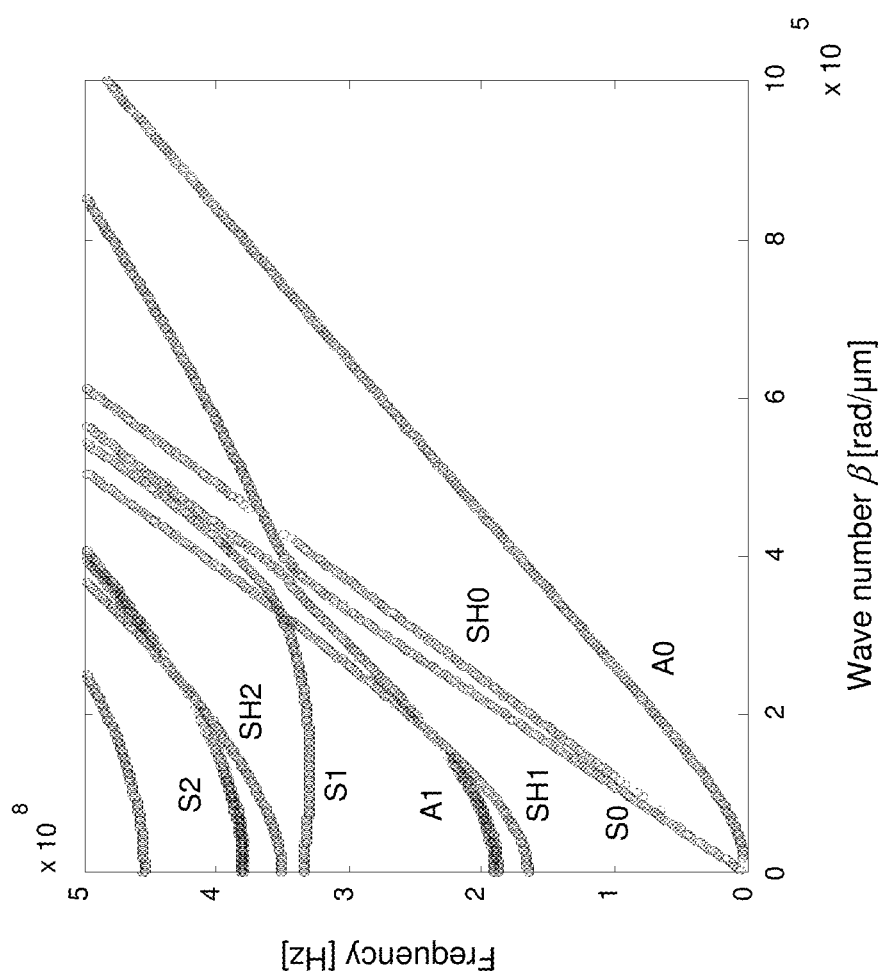
FIGS. 11A-11B depict dispersion of plate modes of operation of a mechanical resonating structure.
Figure 11B:
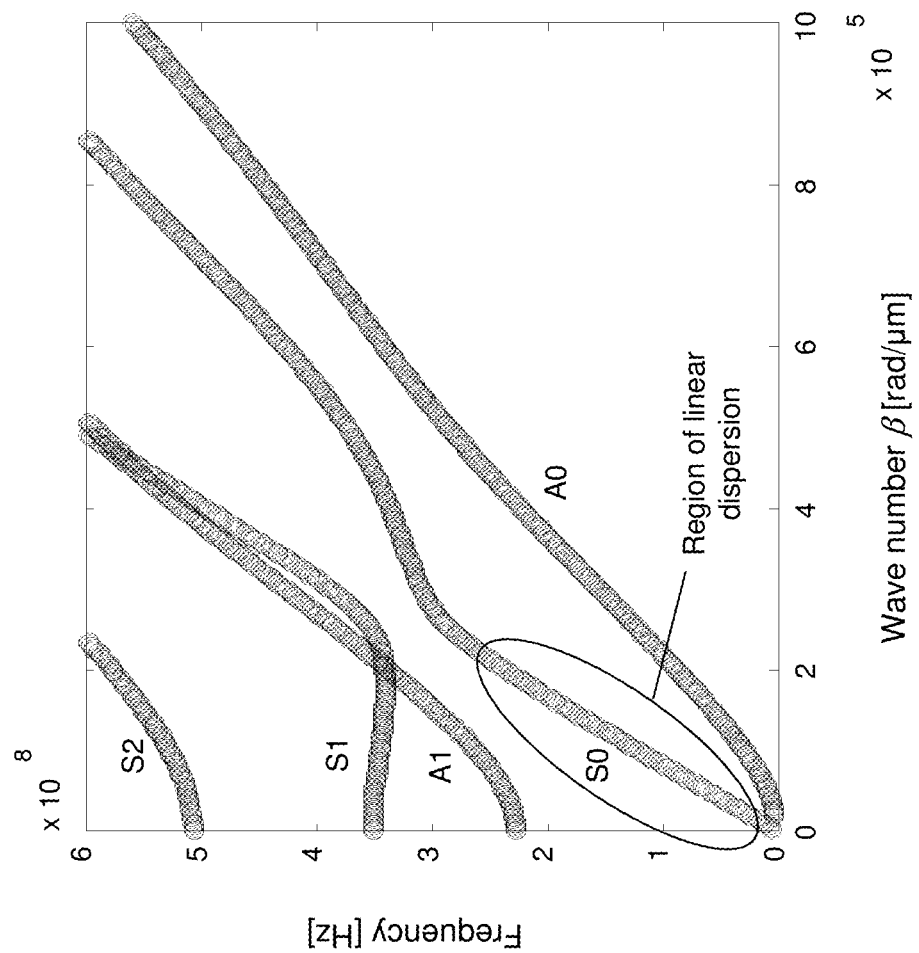
Figure 16:
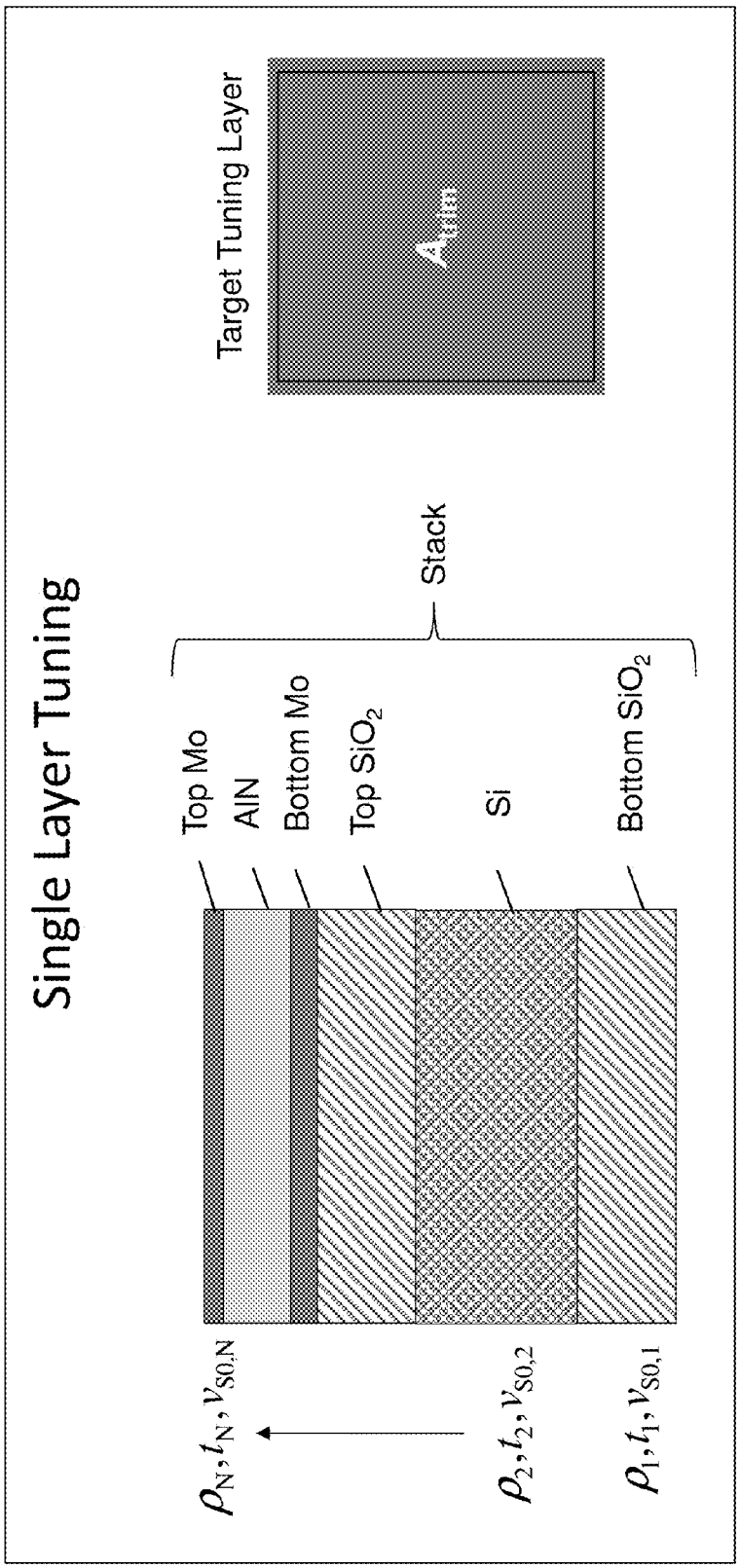

FIG. 11A depicts propagating non-evanescent eigenmodes for a pure AT-cut Quartz plate of a specific thickness. Other piezoelectric materials such as zinc oxide can have similar plate modes such as shown in FIG. 11A. FIG. 11B depicts propagating non-evanescent eigenmodes for a plate with a stack of materials as shown in FIG. 16 having a certain set of specific layer ratios with a specific thickness for the whole stack. FIG. 11A provides a rich illustration of plate modes of operation such as, for example, Sx (symmetric Lamb) modes, Ax (antisymmetric Lamb) modes, and SHx (shear horizontal plate) modes. It should be noted that other stack configurations of a mechanical resonating structure can result in other positions and curvature shapes of the plate modes dispersion as shown in FIGS. 11A-1B. These other stack configurations are contemplated by the present disclosure. Accordingly, FIGS. 11A-11B are considered illustrative and non-limiting.

Figure 12:
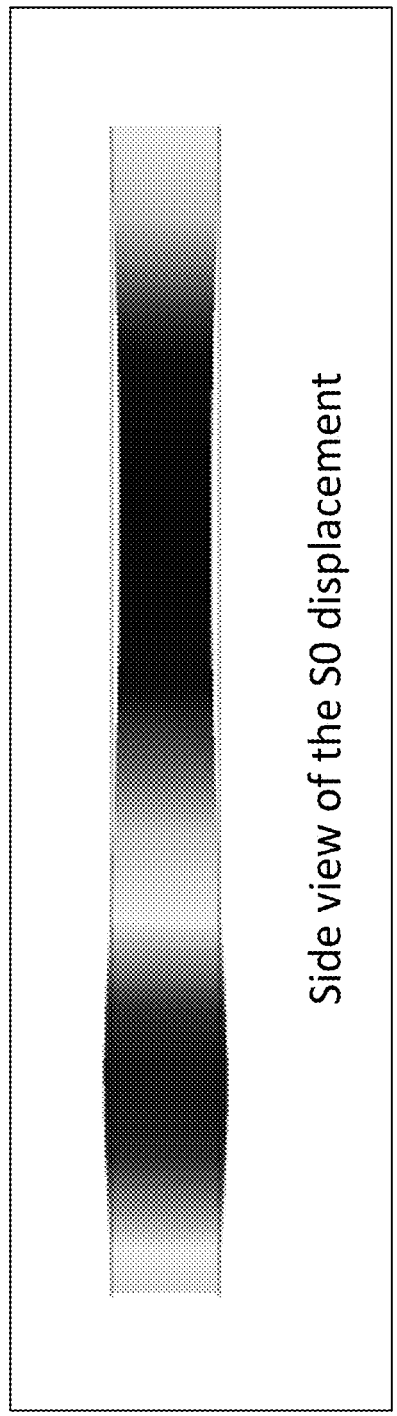
FIGS. 12-13 illustrate mode shapes of operation for a mechanical resonating structure.

In one embodiment, the mechanical resonating structure of the present disclosure can be designed so that its resonance mode of operation is influenced more by a lateral rather than a thickness displacement of the mechanical resonating structure. This mode of operation is depicted in FIGS. 11A-11B as an "S0" mode of operation. The S0 mode in the region depicted in FIGS. 11A-11B shows linear dispersion. This means that the ratio of frequency over lateral wavenumber f/β is constant, thereby the group velocity $v_g$ is equal to the phase velocity $v_p$. In the region of linear dispersion of the S0 mode (see FIG. 11B), the resonance frequency f0 is generally insensitive to the thickness of the plate (or stack) of the mechanical resonating structure. This result can be reasoned if one looks at the shape of the S0 mode, which is basically a plate pressure wave in a lateral direction with a Poisson effect in a thickness direction. Stated another way, in the S0 mode of operation, the mechanical resonating structure resonates primarily in a lateral x and/or y direction (see FIG. 12) than in a z (thickness) direction.

Figure 13:
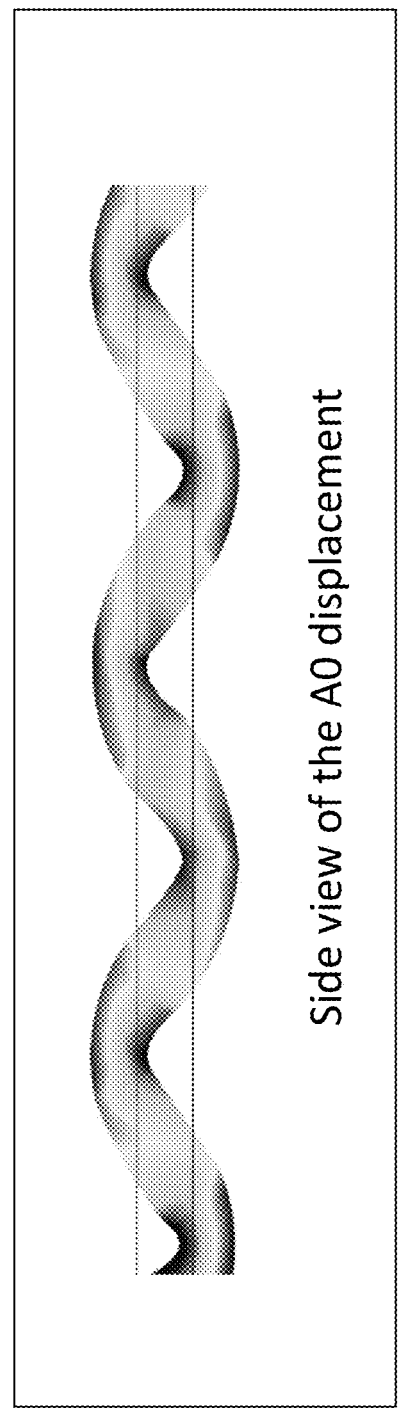
Figure 14:
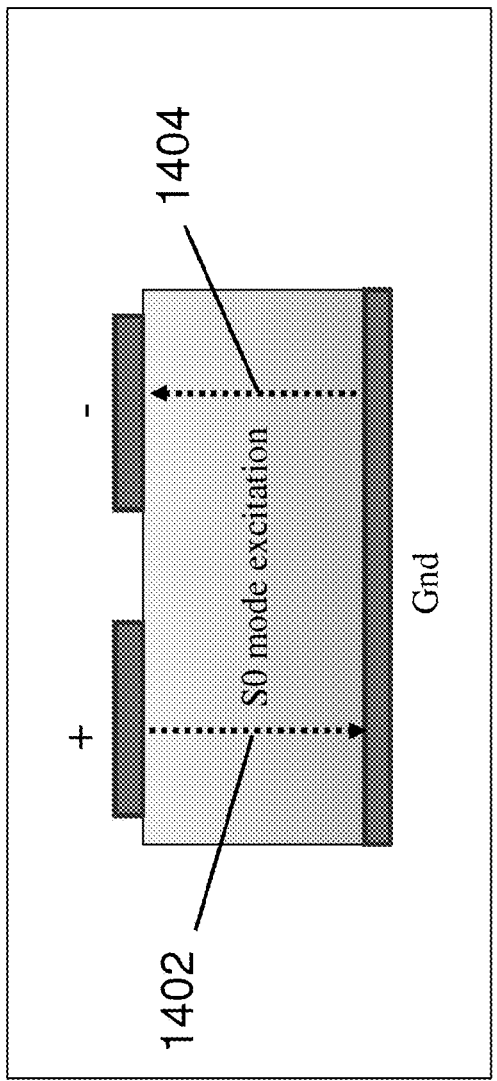
FIGS. 14-15 depict excitation mechanisms for controlling modes of operation of a mechanical resonating structure.
Figure 15:
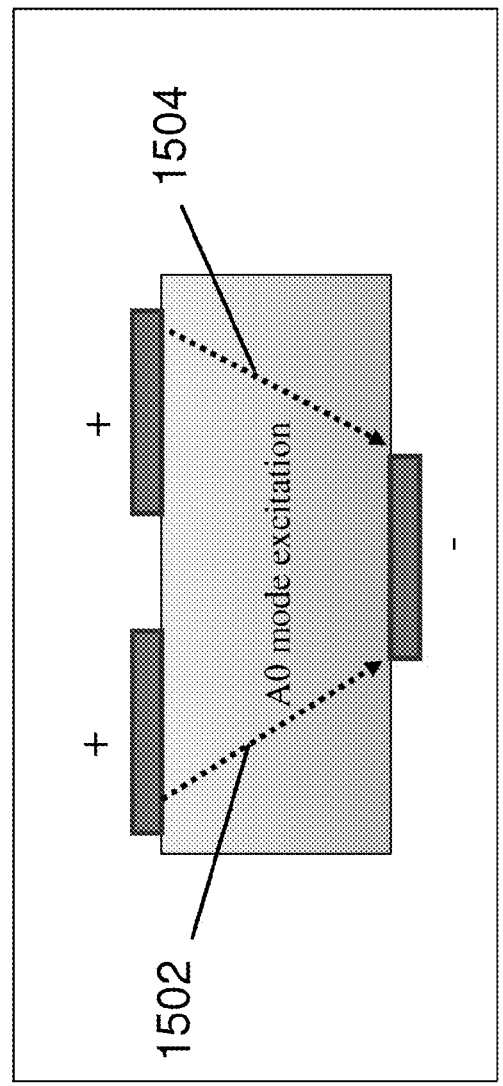

A conductor configuration formed on the mechanical resonating structure can influence whether the resonator operates in the S0 mode, the A0 mode or both. Utilizing an IDT electrode configuration such as IDT electrodes 202 shown in FIGS. 1, 8 and 14 can cause the mechanical resonating structure to operate mostly in the S0 mode. An IDT electrode configuration can among other things cause an electric field that is primarily orthogonal to the lateral directions (see references 1402, 1402) which by means of the piezoelectric effects causes normal stresses in the thickness and lateral directions. A placement of conductors such as shown in FIG. 15 where the electric fields are no longer orthogonal to the lateral dimensions to excite shear stresses (see references 1502 and 1504) can cause the mechanical resonating structure to operate in the A0 mode—see FIG. 13. It should be noted that the above descriptions may be an over simplification of how an S0 or A0 mode mechanical resonating structure can be designed. Other factors for designing the mode of a mechanical resonating structure may be required and are therefore contemplated by the present disclosure.

For the illustrations that follow, it will be assumed that the mechanical resonating structure operates substantially as an S0 mode resonator. However, it is contemplated by the present disclosure that other modes of operation of the mechanical resonating structure illustrated in FIG. 11A may be used with the tuning methods described below for selectively adjusting a resonating frequency (f0) or zero TCF (T0) of the mechanical resonating structure. These other modes may include without limitation SH0-SH2, A0-A1, S1-S2, and other modes not denoted by the illustrations of FIGS. 11A-11B, which may result from other stack configurations and at higher frequency thickness products.

With this in mind, FIG. 16 depicts one embodiment for tuning an operational profile such as f0 and T0 of a mechanical resonating structure. In this embodiment, the mechanical resonating structure comprises six layers: a bottom layer of SiO$_2$, a middle layer of Si, top layer of SiO$_2$, a bottom layer of Mo (Molybdenum), an active layer of AlN, and a top layer of Mo. The material in each layer can be characterized by properties such as its density ($\rho_i$), thickness ($t_i$), and lateral sound velocity ($v_{S0,i}$) as shown to the left of the stack in FIG. 16. The subscript "i" represents the layer number with i=1 . . . N. The effect on the resonance frequency f0 due to an adjustment in the thickness of one of the layers of the stack shown in FIG. 16 can be represented by an approximation described by the following equation:

$$S_{t_{trim}}^{f0} \propto \rho_{trim}(v_{S0,trim} - v_{S0,Stack}) \quad \text{EQ1}$$

When the linear portion of a TCF curve is approximately zero and adjusting the thickness of a layer in the stack is not subject to significant higher-order temperature behavior in comparison to the layers of the stack, then the effect on the zero TCF (T0) as a result of adjusting the thickness of one of the layers of the stack shown in FIG. 16 can be represented by an approximation described by the following equation:

$$S_{t_{trim}}^{T0} \propto \rho_{trim}[v_{S0,trim}(0.5 TCS_{trim} + 0.5\alpha_{z,trim} - \alpha_{xy,Stack})] \quad \text{EQ2}$$

where the effect of trimming such a layer can illustrated by the graphs of FIG. 3F.

The term "trim" as used in the above equations represents a layer in the stack shown in FIG. 16 which can be a candidate for removal (trimming) of material from the layer.

It should be understood, however, that the addition of material to a candidate layer in the stack is also contemplated by the above equations and the equations that follow. Accordingly, when the terms "trim" or "trimming" are used below, such terms can under certain circumstances be substituted with a tuning process that contemplates adding material to a candidate layer to adjust f0 and/or T0. In some instances the addition of material to a layer of the stack will be noted below as a possible tuning solution.

Regarding equations EQ1 and EQ2 above, $S_{t_{trim}}^{f_0}$ represents the sensitivity of f0 to trimming a thickness of one of the layers of the stack shown in FIG. 16. $S_{t_{trim}}^{T_0}$ represents the sensitivity of T0 to trimming a thickness of one of the layers of the stack or an additional layer on the top or bottom of the stack. $\rho_{trim}$ represents the density of the layer being trimmed. $v_{S0,trim}$ represents the sound velocity of the S0 mode in the lateral direction of the layer being trimmed, while $v_{S0,Stack}$ represents the sound velocity of the S0 mode in lateral direction of the stack. $TCS_{trim}$ represents the temperature coefficient of the S0 mode stiffness coefficient of the layer being trimmed. $\alpha_{z,trim}$, represents the thermal expansion in the z-direction of the material being trimmed. $\alpha_{xy}$ represents the thermal expansion in lateral direction(s) of the stack.

From the above approximations of EQ1-EQ2, several conclusions can be drawn. If the density $\rho_{trim}$ of a layer is high, and the magnitude of the sound velocity $v_{S0,trim}$ of the material is significantly greater or smaller than the magnitude of the sound velocity of the stack $v_{S0,Stack}$ then the $S_{t_{trim}}^{f_0}$ sensitivity of the layer being considered for trimming will have a high absolute magnitude. If, on the other hand, the density $\rho_{trim}$ of a material layer is very low, and/or the magnitude of the sound velocity $v_{S0,trim}$ of the layer is similar to the magnitude of the sound velocity of the stack $v_{S0,Stack}$, then the $S_{t_{trim}}^{f_0}$ sensitivity of the layer being considered for trimming will have a low absolute magnitude. Removing (trimming) or adding like material to a material layer with a high absolute magnitude $S_{t_{trim}}^{f_0}$ sensitivity can result in a significant shift in the resonance frequency f0 of the mechanical resonating structure which can be useful when coarse tuning f0 is desirable. Removing or adding like material to a material layer with a low absolute magnitude $S_{t_{trim}}^{f_0}$ sensitivity can result in a small shift in the resonance frequency f0, which can be useful when fine tuning f0 is desirable.

Regarding the $S_{t_{trim}}^{T_0}$ sensitivity, if the density $\rho_{trim}$ of a layer is high, and the magnitude of the sound velocity $v_{S0,trim}$ of the material as well as the absolute magnitude of the temperature coefficient of the stiffness of the material $TCS_{trim}$ is high, then the $S_{t_{trim}}^{T_0}$ sensitivity of such a layer will have a high absolute magnitude. If, on the other hand, the density $\rho_{trim}$ of a material layer is very low, and/or the magnitude of the sound velocity $v_{S0,trim}$ of the material is low and/or the absolute magnitude of the temperature coefficient of the stiffness of the material $TCS_{trim}$ is low, then the $S_{t_{trim}}^{T_0}$ sensitivity of such a layer will be low. Removing or adding like material to a material layer with a high absolute magnitude $S_{t_{trim}}^{T_0}$ sensitivity can result in a significant shift in the zero TCF T0 of the mechanical resonating structure which can be useful when coarse tuning T0 is desirable. Removing or adding like material to a material layer with a low absolute magnitude $S_{t_{trim}}^{T_0}$ sensitivity can result in a small shift in T0 of the mechanical resonating structure, which can be useful when fine tuning T0 is desirable.

It is further observed that if the $S_{t_{trim}}^{f_0}$ sensitivity of the resonance frequency approximates zero for a particular material layer while the $S_{t_{trim}}^{T_0}$ sensitivity of the zero TCF for the same layer is non-zero, then such a layer can serve as a target layer for tuning zero TCF T0 with a negligible shift in the resonance frequency f0. Similarly, if the $S_{t_{trim}}^{T_0}$ sensitivity of the zero TCF T0 approximates zero for a particular material layer while the $S_{t_{trim}}^{f_0}$ sensitivity of the resonance frequency f0 for the same layer is non-zero, then such a layer can serve as a target layer for tuning resonance frequency f0 with a negligible shift in the zero TCF T0.

Based on the above principles, a designer of the mechanical resonating structure can choose layers having material properties and dimensions that would enable a manufacturer to selectively tune the resonance frequency (f0), the zero TCF (T0), or both at the same time. FIG. 17 illustrates a table of $S_{t_{trim}}^{f_0}$ sensitivity, $S_{t_{trim}}^{T_0}$ sensitivity, and ratios thereof for the stack shown in FIG. 16. This table can be determined after a designer has chosen target dimensions and material properties for each layer. A change in the material properties of the mechanical resonating structure can result in other sensitivity and ratio values. Accordingly, the table of FIG. 17 is illustrative and non-limiting to the present disclosure. From the table, it is evident that trimming or adding like material to the Mo layer has the highest $S_{t_{trim}}^{f_0}$ sensitivity and thereby the most influence in changing the resonance frequency f0 (approximately 8 MHz per um of change in thickness). Similarly, trimming or adding like material to the Mo layer has the highest $S_{t_{trim}}^{T_0}$ sensitivity and thereby the most influence in changing the zero TCF T0 (approximately 320 degrees per um of change in thickness). Hence, trimming or adding material to the Mo layer can pose challenges in tuning resonance frequency f0 or the zero TCF T0.

Materials can be chosen for the layers of the mechanical resonating structure so that the ratio of the $S_{t_{trim}}^{f_0}$ sensitivity and the $S_{t_{trim}}^{T_0}$ sensitivity of one layer tracks that of another layer. In the table of FIG. 17, the ratio of the $S_{t_{trim}}^{f_0}$ and the $S_{t_{trim}}^{T_0}$ sensitivities of the SiO$_2$ layer (−45.4) is nearly equal to the ratio of the $S_{t_{trim}}^{f_0}$ and the $S_{t_{trim}}^{T_0}$ sensitivities of the Si layer (−44.5). Consequently, a change in thickness of the Si layer, which causes an offset in the resonance frequency f0 and zero TCF T0 from desired target values, can be compensated by trimming the SiO$_2$ layer.

This can be illustrated by way of an example. Suppose, for instance, that after the mechanical resonating structure has been manufactured it is determined that the resonance frequency f0 of this device is 99.437 MHz (0.563 MHz below an ideal target of 100 MHz) because of a Si thickness deviation. It can be determined that a deviation of −0.563 MHz from the f0 target is due to a thickness deviation in the Si layer of −0.423 um (−0.563 MHz/1.33). This means that the Si layer is thinner than its target thickness by 0.423 um Such a deviation also results in a zero TCF (T0) deviation of −59.2*-0.423=+25.0° C. from a design target of 25.0° C. Since the sensitivity of the SiO$_2$ layer substantially tracks the sensitivity of Si layer, the above resonance frequency f0 offset can be corrected by adjusting the thickness of the SiO$_2$ layer by −0.240 um (−0.563 MHz/−2.35) to cause a shift in f0 by +0.563 MHz. Such a reduction in thickness of the SiO$_2$ layer simultaneously shifts T0 by −24.9° C. (−0.240*106.7). The net offset in T0 after trimming is completed is only +0.1° C.

It should be noted that although the above illustration involve trimming of materials, there may be circumstances where the proper solution for tuning the resonance frequency f0 and the zero TCF T0 is to add like material to the SiO$_2$ layer (i.e., add more SiO$_2$ material to the layer) or to have an initial layer thickness thicker than a desired design target.

Figure 18:
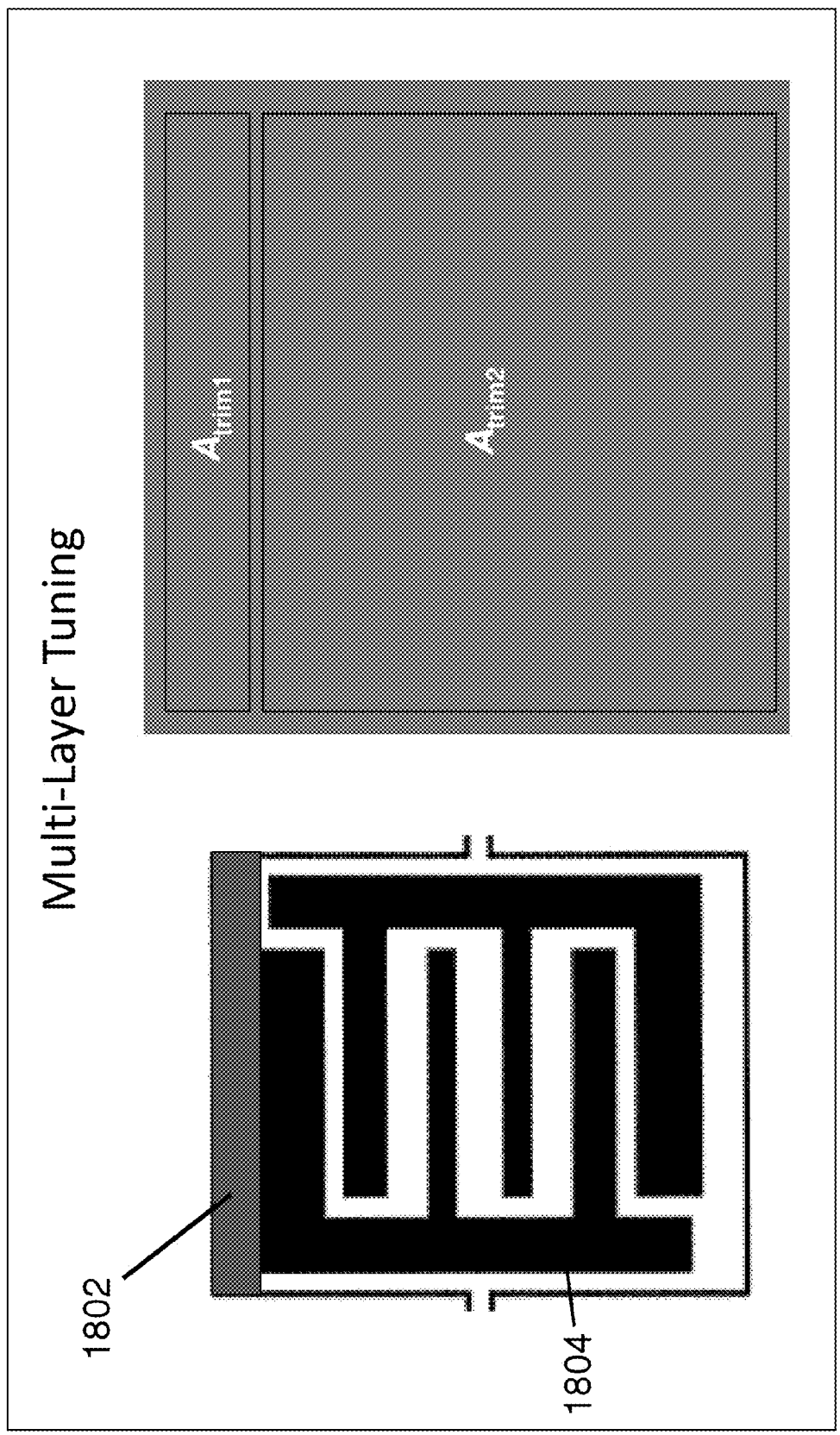
FIGS. 18-19 depict a multi-layer technique for tuning an operational profile of a mechanical resonating structure.

The above embodiments illustrate a single layer approach to tuning. The present disclosure, however, also contemplates a multi-layer approach to tuning as depicted in FIG. 18. FIG. 18 illustrates a top view of a mechanical resonating structure with two exposed trimming regions, $A_{trim1}$ based on an AlN layer 1802, and $A_{trim2}$ based on the Mo layer 1804. Other exposed layers such as a SiO$_2$ layer and the AlN layer can be used for $A_{trim1}$ and $A_{trim2}$, respectively. The two layers may be specifically deposited on top of the other resonator layers and may be patterned to achieve specific ratios of $A_{trim1}$ and $A_{trim2}$. After tuning the resonance frequency f0 by trimming $A_{trim1}$ and $A_{trim2}$, the deviation of the resonance frequency from a design target can be approximated by the following equation:

$$\Delta f_0 = S_{t_{Si}}^{f0} \Delta t_{Si} + A_{trim1} S_{t_{trim1}}^{f0} \Delta t_{trim1} + A_{trim2} S_{t_{trim2}}^{f0} \Delta t_{trim2}.$$

The above equation can be simplified by substituting $A_{trim1} = 1 - A_{trim2}$, and $\Delta t_{trim1} = K_{Mill} \Delta t_{trim2}$, which results in the equation:

$$\Delta f_0 = S_{t_{Si}}^{f0} \Delta t_{Si} + [(1-A_{trim2}) S_{t_{trim1}}^{f0} K_{Mill} + A_{trim2} S_{t_{trim2}}^{f0}] \Delta t_{trim2}.$$

$K_{mill}$ represents the relative milling constant of the $A_{trim1}$ material with regard to the trimming process. By allowing $\Delta f_0 = 0$ one can solve for a trimming value of $\Delta t_{trim2}$ for which the resonance frequency f0 is on target with a desired value:

$$\Delta t_{trim2} = -\frac{S_{t_{Si}}^{f0}}{(1-A_{trim2}) K_{Mill} S_{t_{trim1}}^{f0} + A_{trim2} S_{t_{trim2}}^{f0}} \Delta t_{Si}.$$

After tuning zero TCF T0 by trimming $A_{trim1}$ and $A_{trim2}$, the deviation in T0 from a design target can be approximated by the following equation:

$$\Delta T_0 = S_{t_{Si}}^{T0} \Delta t_{Si} + A_{trim1} S_{t_{trim1}}^{T0} \Delta t_{trim1} + A_{trim2} S_{t_{trim2}}^{T0} \Delta t_{trim2}.$$

The above equation can again be simplified by substituting $A_{trim1} = 1 - A_{trim2}$, and $\Delta t_{trim} = K_{mill} \Delta t_{trim2}$, which results in the equation:

$$\Delta T_0 = S_{t_{Si}}^{T0} \Delta t_{Si} + [(1-A_{trim2}) S_{t_{trim1}}^{T0} K_{Mill} + A_{trim2} S_{t_{trim2}}^{T0}] \Delta t_{trim2}.$$

Substituting $\Delta t_{trim2}$ equation determined above for $\Delta f_0 = 0$ results in the equations:

$$\Delta T_0 = \left[ S_{t_{Si}}^{T0} - \frac{K_{Mill} S_{t_{trim1}}^{T0}(1-A_{trim2}) + S_{t_{trim2}}^{T0} A_{trim2}}{K_{Mill} S_{t_{trim1}}^{f0}(1-A_{trim2}) + S_{t_{trim2}}^{f0} A_{trim2}} S_{t_{Si}}^{f0} \right] \Delta t_{Si}, \text{ or}$$

$$\Delta T_0 = S_{t_{Si},\mathit{eff}}^{T0} \Delta t_{Si},$$

where $S_{t_{Si},\mathit{eff}}^{T0}$ is equal to:

$$S_{t_{Si},\mathit{eff}}^{T0} = S_{t_{Si}}^{T0} - \frac{K S_{t_{trim1}}^{T0}(1-A_{trim2}) + S_{t_{trim2}}^{T0} A_{trim2}}{K S_{t_{trim1}}^{fr}(1-A_{trim2}) + S_{t_{trim2}}^{fr} A_{trim2}} S_{t_{Si}}^{fr}.$$

From the above equations several observations can be drawn.

CASE 1 (T0 only tuning): a designer can manufacture the mechanical resonating structure so that the zero TCF T0 can be tuned while maintaining the resonance frequency f0 at a fixed value. This can be accomplished by adjusting $A_{trim2}$ so that the term $[(1-A_{trim2}) S_{t_{trim1}}^{f0} K_{Mill} + A_{trim2} S_{t_{trim2}}^{f0}] \Delta t_{trim2}$ is zeroed out, which can be achieved by setting $$A_{trim2} = \frac{S_{t_{trim1}}^{f0} K_{Mill}}{S_{t_{trim1}}^{f0} K_{Mill} - S_{t_{trim2}}^{f0}}.$$

When zeroing out this term, $\Delta f_0$ reduces to a constant, $\Delta f_0 = S_{t_{Si}}^{f0} \Delta t_{Si}$. This means that the designer would have to accept an f0 offset equal to the deviation in thickness of the Si layer. Since an f0 offset can be readily adjusted in certain applications with a fractional-N synthesizer, such a tradeoff may be acceptable to a user of the mechanical resonating structure. By forcing $\Delta f_0$ to be a constant, the zero TCF T0 can be tuned exclusively. This can be accomplished by allowing $\Delta T_0 = 0$, which results in the equation:

$$\Delta t_{trim2} = -\frac{S_{t_{Si}}^{T0}}{(1-A_{trim2}) S_{t_{trim1}}^{T0} K_{Mill} + A_{trim2} S_{t_{trim2}}^{T0}} \Delta t_{Si}.$$

The foregoing equation can be used to calculate $\Delta t_{trim2}$, a thickness adjustment for $A_{trim2}$. Once such a determination is made, the manufacturer can simultaneously adjust $A_{trim1}$ and $A_{trim2}$ and achieve a desired T0 target.

CASE 2 (f0 only tuning): a designer can manufacture the mechanical resonating structure so that the resonance frequency f0 can be tuned while maintaining the zero TCF T0 at a fixed value. This can be accomplished by adjusting $A_{trim2}$ so that the term $[(1-A_{trim2}) S_{t_{trim1}}^{T0} K_{Mill} + A_{trim2} S_{t_{trim2}}^{T0}] \Delta t_{trim2}$ zeroed out, which can be achieved by setting $$A_{trim2} = \frac{S_{t_{trim1}}^{T0} K_{Mill}}{S_{t_{trim1}}^{T0} K_{Mill} - S_{t_{trim2}}^{T0}}.$$

When zeroing out this term, $\Delta T_0$ reduces to a constant, $\Delta T_0 = S_{t_{Si}}^{T0} \Delta t_{Si}$. This means that the designer would have to accept a T0 offset equal to the deviation in thickness of the Si layer. A user of the mechanical resonating structure may not be concerned with the T0 offset if the offset is small or if the offset can be compensated with a controlled temperature environment where temperature deviations are negligible. By forcing $\Delta T_0$ to be a constant, f0 can be tuned exclusively. This can be accomplished by allowing $\Delta f_0 = 0$, which results in the equation:

$$\Delta t_{trim2} = -\frac{S_{t_{Si}}^{f0}}{(1-A_{trim2}) K_{Mill} S_{t_{trim1}}^{f0} + A_{trim2} S_{t_{trim2}}^{f0}} \Delta t_{Si}$$

The foregoing equation can be used to calculate $\Delta t_{trim2}$, a thickness adjustment for $A_{trim2}$. Once such a determination is made, the manufacturer can simultaneously adjust $A_{trim1}$ and $A_{trim2}$ and achieve a desired f0 target.

CASE 3 (f0 and T0 tuning): a designer can manufacture the mechanical resonating structure so that the resonance frequency f0 and the zero TCF T0 are simultaneously tuned. This can be accomplished by adjusting $A_{trim2}$ so that the term $S_{t_{Si},\mathit{eff}}^{T0} \to 0$. This result can be achieved when the following equation is satisfied:

$$A_{trim2}\Big|_{S_{t_{Si},eff}^{T_0}\to 0} = \frac{K_{Mill}\left[\frac{S_{t_{Si}}^{T_0}}{S_{t_{Si}}^{f_0}}S_{t_{trim1}}^{f_0} - S_{t_{trim1}}^{T_0}\right]}{S_{t_{trim2}}^{T_0} - \frac{S_{t_{Si}}^{T_0}}{S_{t_{Si}}^{f_r}}S_{t_{trim1}}^{f_0} + K_{Mill}\left[\frac{S_{t_{Si}}^{T_0}}{S_{t_{Si}}^{f_0}}S_{t_{trim1}}^{f_0} - S_{t_{trim1}}^{T_0}\right]}$$

where $A_{trim2}$ has to fulfill $0 < A_{trim2} < 1$. Under these conditions, a change in f0 and T0 after trimming tracks exactly the changes in f0 and T0 caused by a deviation in the thickness of the Si layer, for example, much like in the single layer tuning illustration discussed above where the $SiO_2$ layer tracked the Si layer. The difference here, however, is that two materials are being trimmed simultaneously ($A_{trim1}$ and $A_{trim2}$) as opposed to one trimming material $A_{trim}$—see FIG. 16.

Figure 19:
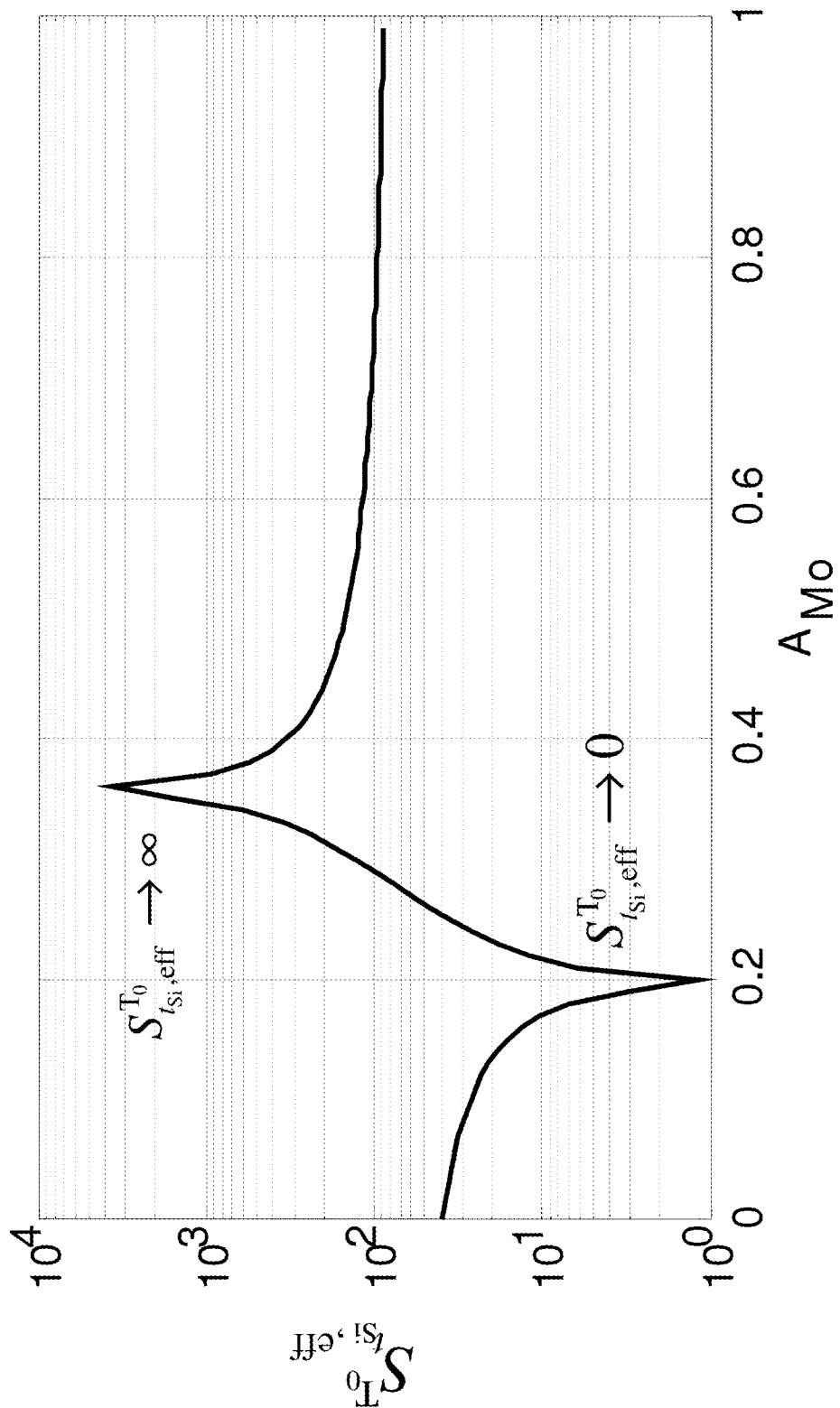

Cases 1 and 3 can be summarized by FIG. 19. Case 1 occurs when $S_{t_{Si},eff}^{T_0} \to \infty$ and case 3 occurs when $S_{t_{Si},eff}^{T_0} \to 0$ For different tuning materials case 2 and 3 can show similar plots to FIG. 19.

It should be noted that the present disclosure is not limited by the above illustrations for tuning f0, T0 or both. The present disclosure contemplates, for example, that more than two tuning layers are possible with the aforementioned principles adapted to support such a structure. The present disclosure also contemplates other variants of the above structures and corresponding equations, which would support selective tuning of f0, T0 or both. Accordingly, the above equations are illustrative and non-limiting to the present disclosure.

Figure 10A:
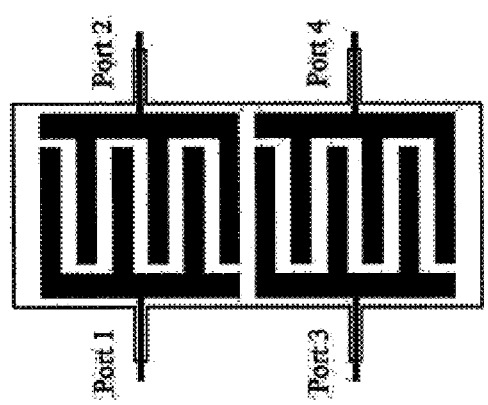
FIGS. 10A-10B illustrate a four-port mechanical resonating structure according to embodiments of the present disclosure.
Figure 10B:
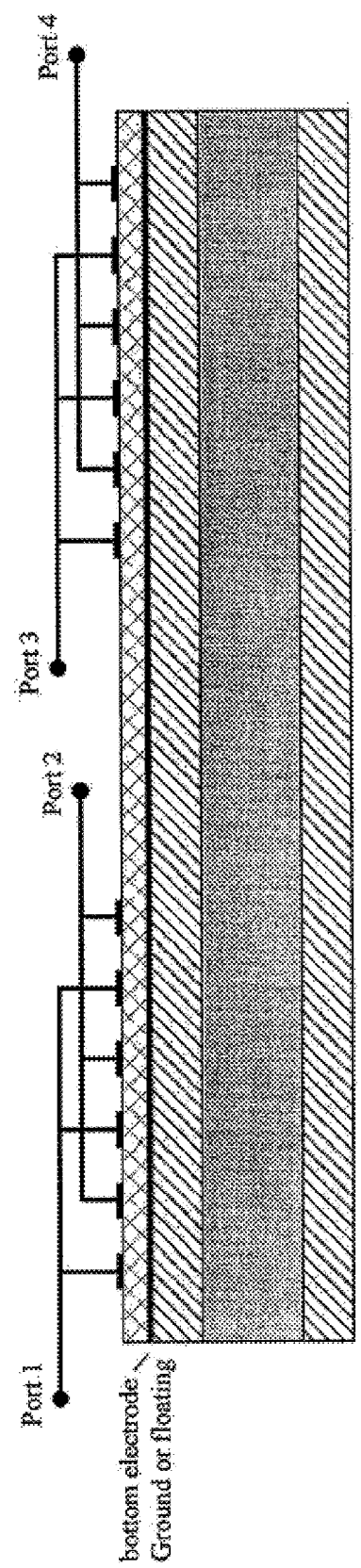
Figure 20:
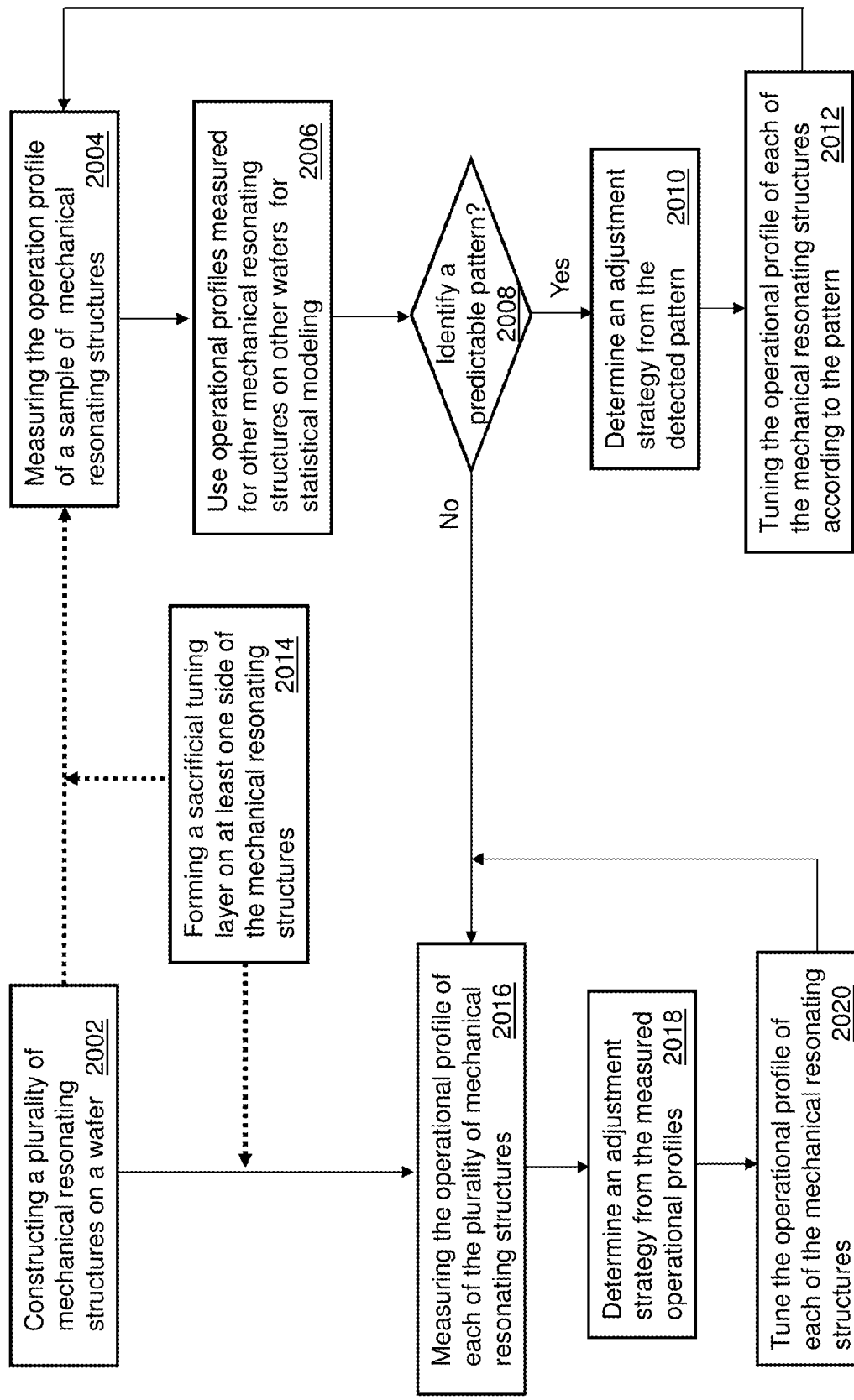
FIG. 20 depicts a method for adjusting an operational profile of a mechanical resonating structure.

FIG. 20 depicts a method 2000 for adjusting an operational profile of a mechanical resonating structure. An operational profile in the present context can mean a measure of operational parameters such as the resonance frequency f0, the positioning of a zero TCF T0, the profile of a TCF (e.g., substantially flat vs. severely parabolic), TCS, or other parametric factors of a mechanical resonating structure that can affect its operational performance relative to a desired operational profile established by the manufacturer of these devices. With this in mind, method 2000 can begin with step 2002, where a plurality of mechanical resonating structures such as described earlier are constructed on a wafer. Because of the possible small dimensions of a mechanical resonating structure, a single wafer can include hundreds (or thousands) of dies each carrying a two-port or four-port mechanical resonating structure such as shown in FIGS. 9A and 10A.

In step 2016, the operational profile of each or a portion of the plurality of mechanical resonating structures on a wafer can be measured with measuring equipment. The measuring equipment can include an excitation source, equipment capable of measuring a resonant frequency of a mechanical resonating structure, and a controlled environmental system such as a chamber for controlling temperature and other environmental factors such as humidity, pressure, and contaminants. The excitation source can comprise a signal generator that stimulates each mechanical resonating structure with an electrical signal applied to a first port of the device (see port 1 of FIG. 9A) thereby causing the structure to resonate. To determine a resonance frequency offset, and a zero TCF offset of each mechanical resonating structure, the environmental chamber can be controlled to vary the temperature over an expected operating range of the device (e.g., −40° C. and 85° C.). Equipment can be connected to a second port (see port 2 of FIG. 9A) to measure a change in the resonant frequency as a function of temperature. To save test time, all or groups of mechanical resonating structures on a wafer can be simultaneously stimulated and sampled over the operating temperature range.

From these measurements, the resonance frequency f0 and zero TCF T0 offset of each device can be determined and compared to a desired resonance frequency and a desired zero TCF (i.e., a desired operational profile). For devices that do not match the desired resonance frequency and/or the desired zero TCF an estimation can be made that the thicknesses of the active material, Si layer and/or the $SiO_2$ layers (first, second and third layers 210, 212, 214) is offset from desirable thicknesses that are known empirically or by computer modeling to produce the desired operational profile.

In another embodiment, it is contemplated that deviations in the thickness of any of the layers in a stack of a mechanical resonating structure can be measured during the manufacturing process. For example, a manufacturer can measure the thickness of the Si layer and record such readings for the particular wafer in question for later use during the tuning process by the same manufacturer or another party contracted to perform tuning of the mechanical resonating structure. By measuring the Si layer thickness, the party who tunes the mechanical resonating structure can easily determine an offset from a desired target Si layer thickness and thereby assess an offset in f0 and T0 without performing the measurements described in step 2016. Hence, by measuring and recording the thicknesses of particular layers in the stack (e.g., Si layer) that tend to vary during the manufacturing process, f0 and T0 offsets can be quickly determined, thereby enabling a party to tune without initial measurements. The more elaborate measuring techniques discussed in step 2016 can then be applied to a sampling of devices on a wafer to verify that the tuning process was successful.

From a magnitude of the estimated offset(s) in thicknesses an adjustment strategy can be determined in step 2018 for adding and/or removing one or more materials from each mechanical resonating structure to achieve desirable ratios between one or more layers that will substantially achieve the desired operational profile, such as set by the manufacturer.

The adjustment strategy can be determined from empirical analysis of the mechanical resonating structure which can be quantified as look-up tables of thickness ratios with a corresponding measure of the operational profile of a mechanical resonating structure as these ratios are incrementally increased or decreased. Alternatively, or in combination, mathematical algorithms modeling the operational profile of the mechanical resonating structure as a function of thickness ratios can be used to determine an adjustment strategy such as the embodiments described for FIGS. 16-19 or suitable variants thereof. A combination of empirical and mathematical modeling can also be used to determine an adjustment strategy. Additionally, consideration can be given in either of the above adjustment strategies to a determination of which thickness ratio(s) are most cost and time effective as adjustment candidates to achieve the desired operational profile of the device.

Figure 21:
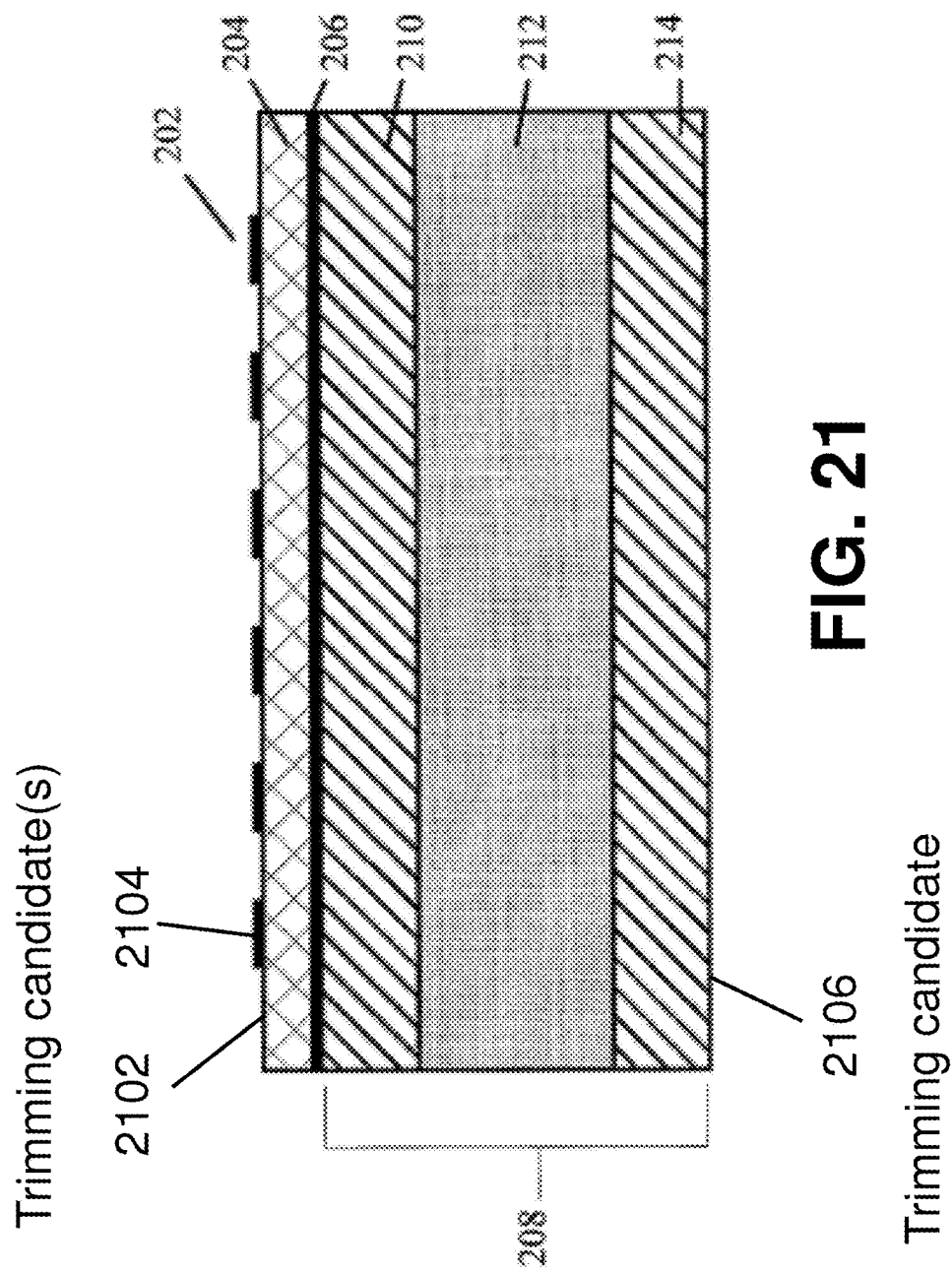
FIGS. 21, 22, 23A, and 23B illustrate various tuning candidates for adjusting the operational profile of a mechanical resonating structure according to the method of FIG. 11.

At step 2020, the operational profile of each mechanical resonating structure can be adjusted according to the strategy determined in step 2018. FIG. 21 depicts an illustrative embodiment of three candidates layers 2102 (the active layer 204), 2104 (the IDT electrodes 202), and 2106 (the third layer 214). Each candidate layer has an exposed surface which can be readily targeted for trimming (i.e., the removal of material) using common etching techniques such as chemical etching, focused ion beaming (FIB) etching and/or photolithography. Chemical etching can be useful for the third layer 214 since it is concealed by a cavity (see FIGS. 6G and 7F). FIB etching and/or lithography can be used to etch the active layer 204 between the electrodes 202, and/or the electrodes 202. It should be evident by the target candidates of FIG. 21 that a number of trimming combinations can be used for adjusting the operational profile of a mechanical resonating structure. It should also be evident that the exposed surface area of the active layer 204 and electrodes 202 can be trimmed in whole or in part thereby providing further control in the adjustment process.

Figure 22:
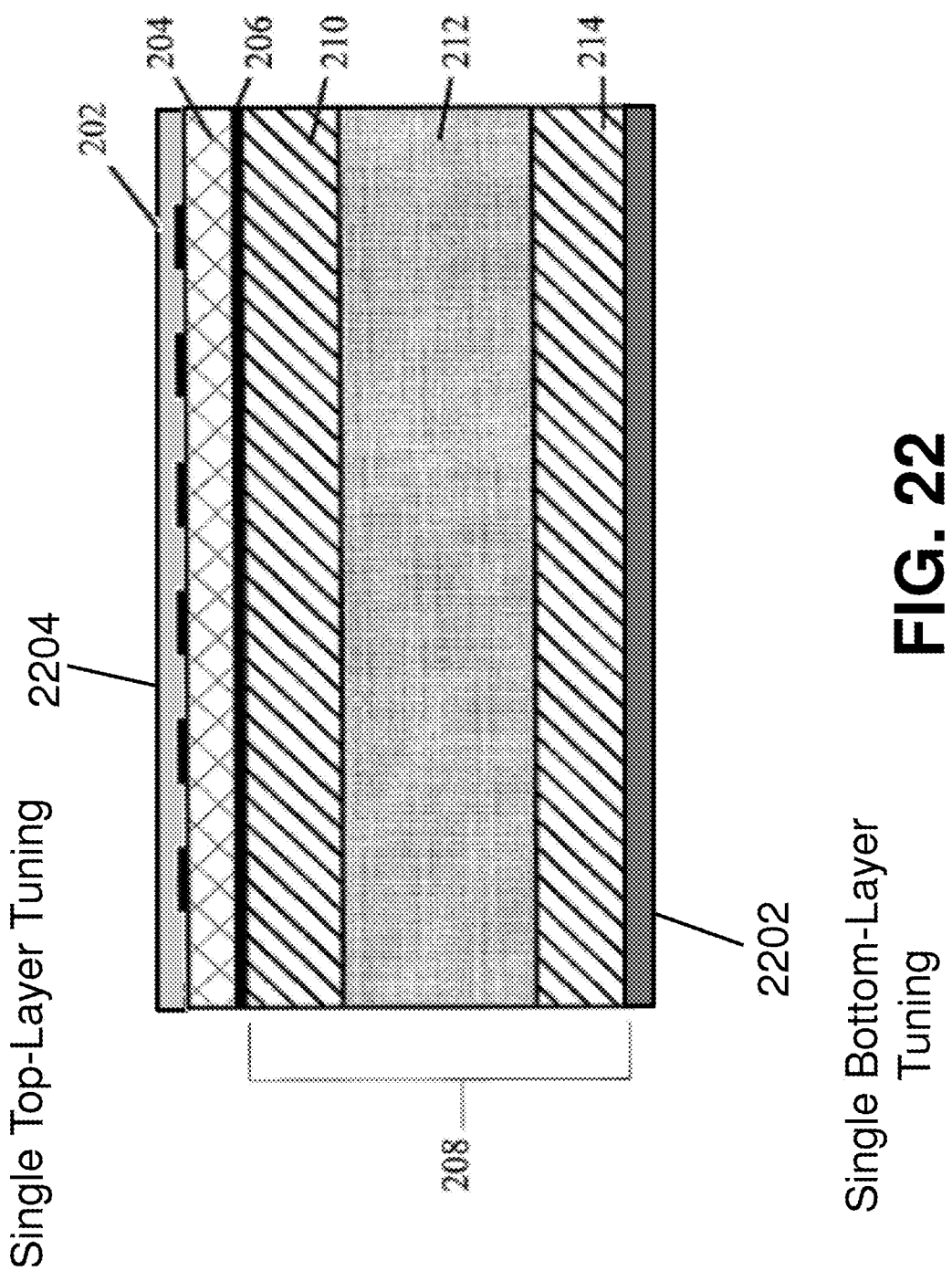

FIG. 22 depicts yet another embodiment for adjusting the operational profile of a mechanical resonating structure. In this embodiment, the manufacturing process described in FIGS. 6 and 7 can be adapted to form an additional layer on the top most or bottom most layer—see layers 2202 and 2204. In one embodiment, the additional layers can be formed of $SiO_2$ so that effectively the third layer is thicker than the first layer 210 thereby providing an additional variable for tuning the operational profile of the mechanical resonating structure. In another embodiment, the additional layers 2202 and 2204 can be formed of other materials that may be useful for tuning the operational profile of mechanical resonating structure. These other materials may include without limitation silicon, silicon oxide, silicon carbide, silicon nitride, aluminum, molybdenum, ruthenium, titanium, tungsten, sapphire, quartz, germanium, gallium arsenide, aluminum nitride, zinc oxide and diamond. In the embodiments of FIG. 22, layers 2102 and 2104 remain trimming targets as described previously for FIG. 21.

It should be noted that tuning step 2020 can be applied simultaneously to all of the mechanical resonating structures, or a subset thereof, depending on the flexibility of the trimming equipment being used. Once the tuning cycle has been completed, steps 2016-2020 can be repeated if necessary to verify the accuracy of the tuning step. Additionally, method 2000 can be adapted so that initially step 2020 represents a coarse tuning of the mechanical resonating structures to avoid excessive tuning. In this embodiment, a second iteration can be performed at a higher tuning resolution (i.e., fine tune layer adjustment). A third iteration can be applied to verify that the mechanical resonating structures have achieved the desired operational profile.

Figure 23A:
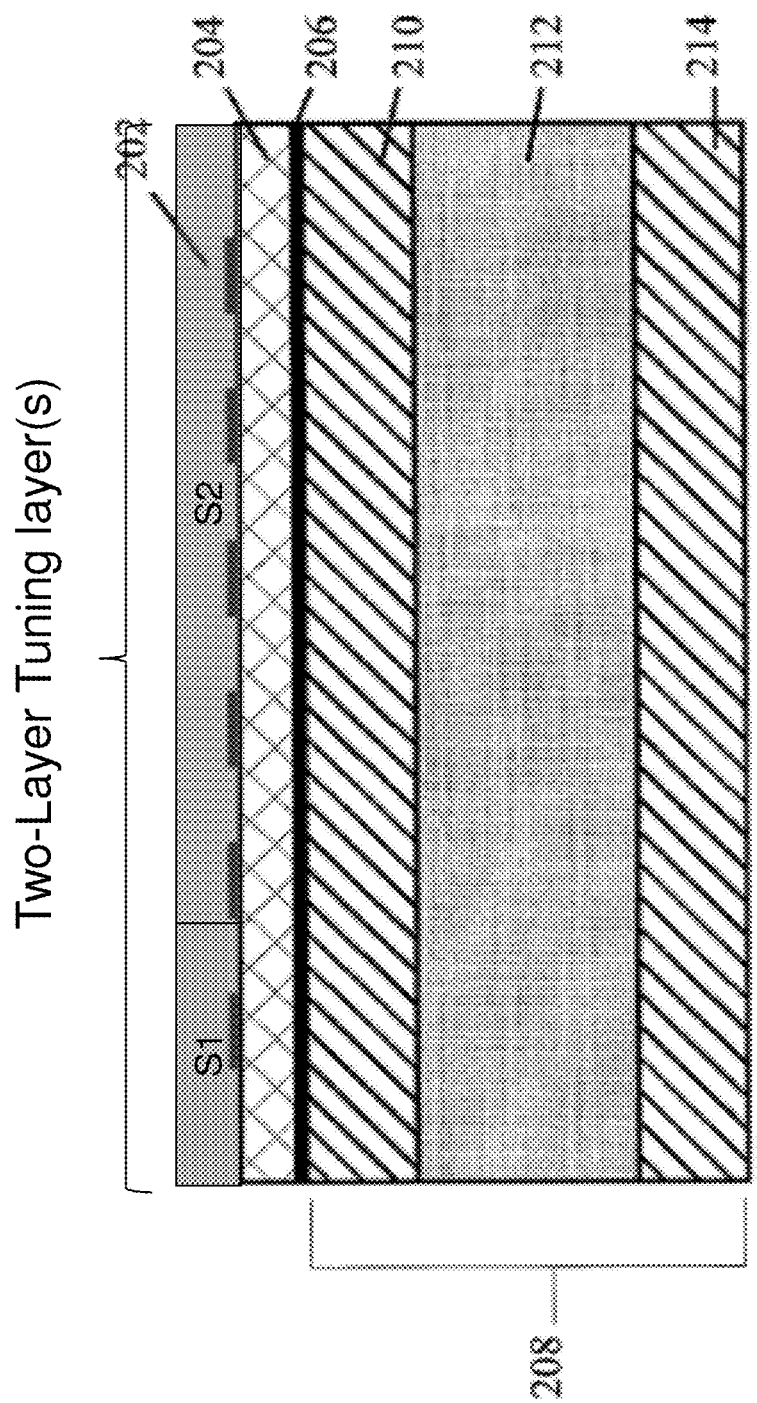
Figure 23B:
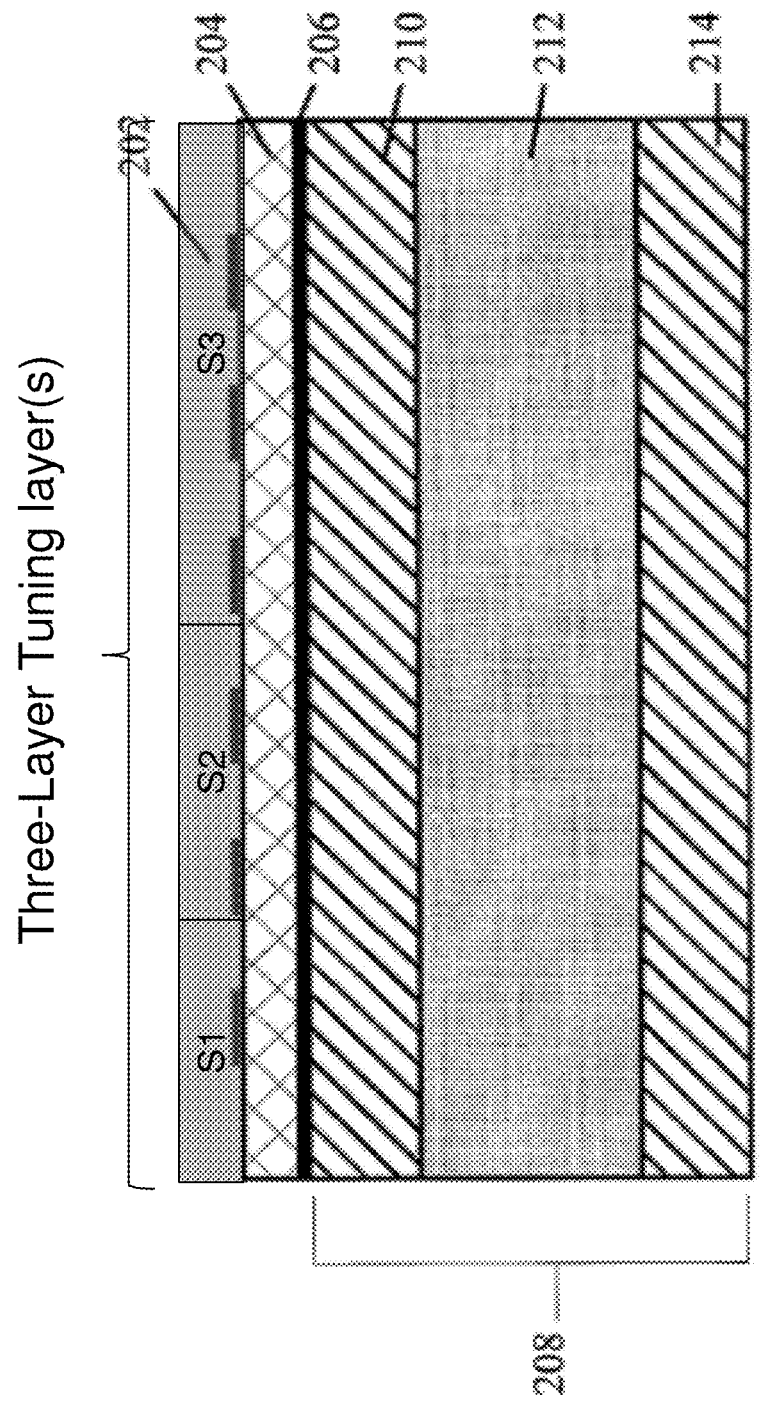

When the thicknesses of the exposed layers of the mechanical resonating structure are insufficient for tuning according to the embodiments of FIGS. 21-22, a sacrificial tuning layer can be formed in step 2014 on at least one side of the mechanical resonating structure. FIG. 23A depicts sacrificial tuning layers S1-S2 deposited on a top surface of a mechanical resonating structure. The term "sacrificial" in the present context can mean that materials S1-S2 can be removed in whole or in part for tuning purposes. Sacrificial materials S1-S2 can be $SiO_2$ which can be deposited selectively between the IDT electrodes 202, but also can be two additional deposited patterned materials. In this configuration, the multi-layer tuning techniques described above can be used for tuning the mechanical resonating structure. FIG. 23B illustrates three layer trimming candidates, which can be adapted to the above multilayer methods.

To improve manufacturing throughput, statistical modeling (such as linear regression) can be used to determine the tuning strategy without measuring the operational profile of all mechanical resonating structures on a wafer. In this embodiment, the operational profile of a sampling of mechanical resonating structures (e.g., 32 devices) can be measured at step 2004 according to the measurement techniques described earlier. At step 2006, the operational profile measured for mechanical resonating structures of prior wafer lots can be used in the statistical modeling process to improve predictability. If in step 2008 it is determined that a correlation of the operational profiles measured between wafer lots and/or of the sampling of devices within a wafer is unsatisfactory, then the more time consuming tuning process of steps 2016-2020 can be applied.

If, on the other hand, the correlation of the operational profiles measured between wafer lots and devices sampled on a wafer is reasonably high to produce predictable patterns of a desirable accuracy and confidence level, then the tuning adjustment strategy can be determined at step 2010 according to the statistical sampling. In this embodiment, the tuning strategy determined from statistical modeling can be applied across all or subgroups of mechanical resonating structures in step 2012. To avoid excessive trimming of the sacrificial layer, a first iteration of step 2012 can be applied as a coarse tune in the event the statistical models were in fact not sufficiently accurate to predict a fine tune. In this embodiment, one or more additional iterations of steps 2004-2012 can take place before a fine tuning process is applied to all mechanical resonating structures on the wafer.

Upon reviewing the aforementioned embodiments, it would be evident to an artisan with ordinary skill in the art that the above embodiments of method 1100 can be modified, reduced, rearranged, or enhanced without departing from the scope and spirit of the claims described below. For example, method 1100 can be adapted so that the tuning process is applied to mechanical resonating structures that have been removed from a wafer as individual devices prior to packaging. Method 1100 can also be adapted to form one or more sacrificial layers on lateral surfaces of the mechanical resonating structures, and/or bottom surfaces of the mechanical resonating structures, each of the lateral or bottom sacrificial layers being accessible for tuning purposes.

In another embodiment, method 1100 can be adapted to add or remove materials from portions of the mechanical resonating structure to change a mass of one or more layers of materials in the mechanical resonating structure to reduce a variance in the resonant frequency of the mechanical resonating structure over a desired temperature range. Other embodiments of method 1100 are contemplated by the present disclosure.

It should also be evident from the present disclosure that the mechanical resonating structure can be used in many applications including computing devices such as shown in FIG. 24. FIG. 24 depicts a computing device that can utilize one or more of the mechanical resonating structures as described herein. The computing device 2400 can comprise a wireline and/or wireless transceiver 2402 (herein transceiver 2402), a user interface (UI) 2404, a power supply 2414, a location receiver 2416, motion detector(s) 2418, and a controller 2406 for managing operations thereof. The transceiver 2402 can support short-range or long-range wireless access technologies such as infrared, Bluetooth, WiFi, Digital Enhanced Cordless Telecommunications (DECT), or cellular communication technologies, just to mention a few. Cellular technologies can include, for example, CDMA-1X, UMTS/HSDPA, GSM/GPRS, TDMA/EDGE, EV/DO, WiMAX, SDR, LTE, as well as other next generation wireless communication technologies as they arise. The transceiver 2402 can also be adapted to support circuit-switched wireline access technologies (such as PSTN), packet-switched wireline access technologies (such as TCPIP, VoIP, etc.), and combinations thereof.

The UI 2404 can include a depressible or touch-sensitive keypad 2408 with a navigation mechanism such as a roller ball, a joystick, a mouse, or a navigation disk for manipulating operations of the computing device 2400. The keypad 2408 can be an integral part of a housing assembly of the computing device 2400 or an independent device operably coupled thereto by a tethered wireline interface (such as a USB cable) or a wireless interface supporting for example Bluetooth. The keypad 2408 can represent a numeric keypad commonly used by phones, and/or a QWERTY keypad with alphanumeric keys. The UI 2404 can further include a display 2410 such as monochrome or color LCD (Liquid Crystal Display), OLED (Organic Light Emitting Diode) or other suitable display technology for conveying images to an end user of the computing device 2400. In an embodiment where the display 2410 is touch-sensitive, a portion or all of the keypad 2408 can be presented by way of the display 2410 with navigation features.

The UI 2404 can also include an audio system 2412 that utilizes common audio technology for conveying low volume audio (such as audio heard only in the proximity of a human ear) and high volume audio (such as speakerphone for hands free operation). The audio system 2412 can further include a microphone for receiving audible signals of an end user. The audio system 2412 can also be used for voice recognition applications. The UI 2404 can further include an image sensor 2413 such as a charged coupled device (CCD) camera for capturing still or moving images.

The power supply 2414 can utilize common power management technologies such as replaceable and rechargeable batteries, supply regulation technologies, and charging system technologies for supplying energy to the components of the computing device 2400 to facilitate long-range or short-range portable applications. The location receiver 2416 can utilize common location technology such as a global positioning system (GPS) receiver capable of assisted GPS for identifying a location of the computing device 2400 based on signals generated by a constellation of GPS satellites, thereby facilitating common location services such as navigation.

The computing device 2400 can use motion detectors 2418 such as accelerometers, gyroscopes and a compass to determine an orientation of the device in three-dimensions (3D). The controller 2406 can also utilize computing technologies such as a state machine, a microprocessor, a digital signal processor (DSP), and/or a video processor with associated storage memory such as Flash, ROM, RAM, SRAM, DRAM or other storage technologies.

Figure 25:
FIG. 25 illustrates embodiments utilizing the computing device of FIG. 15.

Several of the aforementioned technologies of the computing device 2400 may require a reference clock signal such as one generated by the mechanical resonating structure described herein for proper operation. Fractional-N synthesizers can be used to adjust the resonating frequency generated by a mechanical resonating structure to a desired frequency used by components of the computing device 2400. Additionally, clock distribution technology can be used to distribute clock signals to such components. For example, the transceiver 2402 may require reference oscillators for mixers of the receiver and transmitter sections. The location receiver 2416 may also require a precision oscillator to generate coordinate measurements from a constellation of satellite signals. The mechanical resonating structure can also be used to support the functions of the motion detectors 2418. Charging system technologies of the power supply 2414 can also require a timing reference. FIG. 25 illustrates some embodiments in which the computing device 2400 (utilizing one or more mechanical resonating structures) in whole or in part is integrated into base stations, satellite systems, WiFi routers, cell phones, watches, clocks, laptop computers, desktop computers, tablets, gaming consoles with 3D gaming accessories, and automobiles. It should be apparent from these illustrations that there may be numerous applications for the mechanical resonating structure which cannot all be described in the present disclosure for practical reasons. Nonetheless, such applications are contemplated by the present disclosure and considered within the scope of the claims described below.

It should also be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present disclosure, but not necessarily in all embodiments. Consequently, appearances of the phrases "in one embodiment," "in an embodiment," or "in some embodiments" in various places throughout the Specification are not necessarily referring to the same embodiment. Furthermore, the particular features, structures, materials, or characteristics can be combined in any suitable manner in one or more embodiments.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several embodiments of this disclosure, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method of fabricating a mechanical resonating structure characterized by a resonance frequency (f0) and a zero temperature coefficient of frequency (T0), the method comprising:
   applying an active layer on a compensating structure, wherein the compensating structure comprises one or more materials having an adaptive stiffness that reduces variation of the resonance frequency (f0);
   applying a sacrificial layer on a surface of the active layer such that a portion of the active layer and a portion of the sacrificial layer are exposed, the sacrificial layer being a material different than the active layer; and
   subsequent to applying the sacrificial layer, adjusting a thickness of the portion of the sacrificial layer to tune a value of f0 and a value of T0.

2. The method of claim 1, wherein the sacrificial layer is a conductor, wherein a configuration of the conductor causes a resonance mode of operation of the mechanical resonating structure to be influenced more by a lateral displacement than by a thickness displacement.

3. The method of claim 1, further comprising adjusting a thickness of the active layer.

4. The method of claim 3, wherein the compensating structure comprises first, second and third layers, wherein the second layer is formed between the first and third layers, wherein the first and third layers are formed of silicon dioxide, and wherein the second layer is formed of silicon.

5. The method of claim 1, further comprising forming a conductor on a surface of the compensating structure prior to applying the active layer.

6. The method of claim 1, wherein applying the sacrificial layer comprises applying the sacrificial layer in a configuration such that the portion of the active layer and the portion of the sacrificial layer are in a side-by-side configuration.

7. A method of fabricating a mechanical resonating structure characterized by a resonance frequency (f0) and a zero temperature coefficient of frequency (T0), the method comprising:
   obtaining a mechanical resonating structure comprising an active layer and a compensating structure, wherein the compensating structure comprises one or more materials having an adaptive stiffness that reduces variation of the resonance frequency (f0);
   patterning a trimming layer on the active layer; and
   adjusting a thickness of the trimming layer to selectively tune a value of f0 and a value of T0.

8. The method of claim 7, wherein the trimming layer is a conductor, wherein a configuration of the conductor causes a resonance mode of operation of the mechanical resonating structure to be influenced more by a lateral displacement than by a thickness displacement.

9. The method of claim 7, further comprising adjusting a thickness of an exposed portion of the active layer.

10. The method of claim 9, wherein the compensating structure comprises first, second and third layers, wherein the second layer is formed between the first and third layers, wherein the first and third layers comprise silicon dioxide and the second layer comprises silicon.

11. The method of claim 7, wherein patterning the trimming layer comprises patterning the trimming layer to be side-by-side with an exposed portion of the active layer.

12. The method of claim 7, wherein patterning the trimming layer comprises patterning the trimming layer to have a greater surface area than an exposed portion of the active layer.

13. The method of claim 7, wherein the trimming layer is an electrode layer, and wherein patterning the trimming layer comprises patterning the trimming layer to form an interdigital transducer.

* * * * *